(12) United States Patent
Omoto

(10) Patent No.: US 10,546,714 B2
(45) Date of Patent: Jan. 28, 2020

(54) ENERGY FILTER AND CHARGED PARTICLE BEAM SYSTEM

(71) Applicant: JEOL Ltd., Tokyo (JP)

(72) Inventor: Kazuya Omoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 15/890,585

(22) Filed: Feb. 7, 2018

(65) Prior Publication Data

US 2018/0301314 A1 Oct. 18, 2018

(30) Foreign Application Priority Data

Feb. 8, 2017 (JP) .................................. 2017-21166

(51) Int. Cl.
*H01J 37/05* (2006.01)
*H01J 37/28* (2006.01)
*H01J 37/147* (2006.01)

(52) U.S. Cl.
CPC .......... *H01J 37/05* (2013.01); *H01J 37/1472* (2013.01); *H01J 37/28* (2013.01); *H01J 2237/057* (2013.01); *H01J 2237/152* (2013.01); *H01J 2237/24485* (2013.01); *H01J 2237/2802* (2013.01)

(58) Field of Classification Search
CPC ... H01J 37/05; H01J 37/1472; H01J 2237/057
See application file for complete search history.

(56) References Cited

U.S. PATENT DOCUMENTS 5,449,914 A * 9/1995 Rose ..................... H01J 37/05
250/305
6,140,645 A * 10/2000 Tsuno ..................... H01J 37/05
250/305

FOREIGN PATENT DOCUMENTS

| JP | 737536 A | 2/1995 |
|---|---|---|
| JP | 200030645 A | 1/2000 |
| JP | 2001243910 A | 9/2001 |

* cited by examiner

Primary Examiner — Eliza W Osenbaugh-Stewart
(74) Attorney, Agent, or Firm — The Webb Law Firm

(57) ABSTRACT

There is provided an energy filter capable of being simplified in structure and of achieving low aberrations. The energy filter (100) includes a first sector magnet (10) and a second sector magnet (20). The first and second magnets (10, 20) are configured mirror-symmetrically with respect to a symmetry plane (M). There are one focal point of crossover in the X direction and one focal point of crossover in the Y direction. The focal point of crossover in the X direction and the focal point of crossover in the Y direction are at an energy dispersive plane (S2). There are two focal points of image in the X direction and two focal points of image in the Y direction. The focal points of image in the X direction and the focal points of image in the Y direction are at the symmetry plane (M) and at an achromatic plane (A2).

8 Claims, 26 Drawing Sheets

|         | A_AAG | A_GGG | B_ABD | B_GBB | B_GDD | C_AAC | C_AGC | C_GGC | C_BBC | C_BDC | C_DDC | C_ACC | C_GCC |
|---------|-------|-------|-------|-------|-------|-------|-------|-------|-------|-------|-------|-------|-------|
| QB-type | -179  | -307  | 1539  | -2804 | -681  | -371  | -393  | 64    | -833  | 1693  | -241  | -409  | -264  |
| U-type  | 975   | 237   | -2036 | 8437  | 379   | -1753 | -370  | 84    | 292   | 387   | 59    | 333   | 41    |

|  | M | Mp | Ri [mm] | Di [mm] | γ δ [rad] | α β [rad] | ΔEx | ΔExc | Δ | Δc | Δℓ | Δcf |
|---|---|---|---|---|---|---|---|---|---|---|---|---|
| ΩB-type | 950 | 105.3 | 0.475 | 0.01 | 5.0E-03 | 1.1E-04 | 8.51 | 0.09 | 1.46 | 2.46 | 155.36 | 259.34 |
| U-type | 7000.0 | 14.3 | 3.5 | 0.01 | 5.0E-03 | 1.4E-05 | 5.93 | 0.12 | 0.60 | 0.56 | 8.61 | 8.03 |

ENERGY FILTER AND CHARGED PARTICLE BEAM SYSTEM

BACKGROUND OF THE INVENTION

Field of the Invention

The present invention relates to an energy filter and charged particle beam system.

Description of Related Art

Electron energy loss spectroscopy (EELS) is an analytical technique of irradiating a sample with an electron beam and producing an EELS spectrum that represents the loss energy levels of electrons transmitted through the sample. The energy that an electron loses within the sample depends on the elements constituting the sample and on how atoms are mutually bonded. Accordingly, it is possible to have various information by examining the spectrum. For example, it is possible to know the kinds of elements contained in the sample and how they are bonded.

The principal functions of an energy filter in transmission electron microscopy (TEM) are implemented by spectroscopy mode and imaging mode.

In the spectroscopy mode, an energy spectrum can be obtained by focusing the energy dispersive plane of the energy filter onto a screen. Especially, the combination technique of transmission electron microscopy (TEM) and an energy filter is referred to as TEM-EELS. The combination technique of scanning transmission electron microscopy (STEM) and an energy filter is referred to as STEM-EELS. In scanning transmission electron microscopy, atomic resolution can be achieved with greater ease than in transmission electron microscopy. Therefore, in recent years, elemental distribution imaging having atomic resolution and using scanning transmission electron microscopy has attracted attention.

In the imaging mode, a TEM image can be obtained by focusing the achromatic plane of the energy filter onto the screen. Furthermore, a TEM image corresponding to certain loss energy levels of electrons can be derived by placing an energy-selecting slit at the energy dispersive plane and selecting only electrons having the certain loss energy levels. In addition, a distribution image of an element can be obtained by selecting loss energy levels intrinsic to the element. This technique is referred to as energy filtering TEM (EF-TEM).

Energy filters are classified into in-column type and post-column type. In the in-column type, an energy filter is placed between the intermediate lens and the projector lens of a transmission electron microscope. On the other hand, in the post-column type, an energy filter is positioned behind a projector lens (i.e., under an electron optical column).

One advantage of the in-column type is that it is not necessary to correct some of aberrations produced from the energy filter itself because these aberrations cancel themselves out owing to the structural symmetry of the energy filter. Another advantage is that a switch can be made between the imaging mode and the spectroscopy mode owing to the projector lens. A further advantage is that it is possible to cope with an imaging operation performed with a wide field of view from low to high magnifications because filtering is done by the energy filter prior to magnification by the projector lens. One disadvantage of the in-column type is that the height of the instrument (i.e., the height of the electron optical columns) is increased because the filter is located between the intermediate lens and the projector lens. This leads to deterioration of the quake resistance. Also, where there are vibrations, the performance of the instrument may be deteriorated. Further, it is not easy to post-install the filter to a general-purpose transmission electron microscope in an attempt to expand its functionality.

One advantage of the post-column type is that it can be easily post-installed to a general-purpose transmission electron microscope. At this time, it is not necessary to alter the height of the instrument. One disadvantage of the post-column type is that numerous component parts are needed to correct aberrations. Also, it is not straightforward to adjust the axis. Furthermore, the cost is increased. Additionally, it is unsuited for low-magnification imaging because of optical restrictions imposed when the filter is connected to a transmission electron microscope.

In the in-column type, it is difficult to add component parts for aberration correction because a space to accommodate these component parts imposes restrictions on the design of the fundamental optical system. Aberration correcting omega filters having additional component parts for aberration correction are disclosed in JP-A-2000-30645 and JP-A-7-37536.

As noted above, the in-column type suffers from the problem that the height of the instrument is increased. On the other hand, JP-A-2001-243910 discloses a 180-degree inversion type aberration correcting omega filter in which an increase in the instrument height is suppressed by setting the sum of the angles through which the electron beam is deflected by the energy filter to 180 degrees.

Various in-column energy filter types such as α type, γ type, and mandolin type are known in addition to Ω type. Furthermore, Ω type in-column energy filters are classified into A-type and B-type according to optical system. Technical details described below are common to all types of energy filters and so in the following example, the B-type of Ω filter is taken as an example.

FIG. 27 schematically illustrates a conventional in-column type energy filter (Ω filter). X, Y, and Z axes are shown as three mutually orthogonal axes in this FIG. 27. The direction of travel of electrons is taken in the Z direction. The direction in which electrons are deflected by a deflecting magnetic field is taken in the X direction. The direction of lines of magnetic force of the deflecting magnetic field is taken in the Y direction.

FIG. 28 shows trajectories of an electron beam in a conventional in-column energy filter. In FIG. 28, the trajectory of zero-loss beam rays B0 and the trajectory of dispersed beam rays B1 are shown.

The optical system of the energy filter includes an entrance crossover plane S1, an entrance image plane A1, an exit crossover plane (energy dispersive plane) S2, and an exit image plane (achromatic plane) A2. The optical system of the energy filter is characterized by these four important planes.

In order to bring out the performance of an energy filter, electrons must be entered such that a crossover is focused at the entrance crossover plane S1 and that an image is focused at the entrance image plane A1. The energy dispersive plane S2 where energy dispersion occurs is formed on the exit side of the energy filter such that the entrance crossover plane S1 and the energy dispersive plane S2 are positioned mirror-symmetrically. The achromatic plane A2 where no energy dispersion occurs is formed such that the entrance image plane A1 and this achromatic plane A2 are positioned mirror-symmetrically. The energy resolution of the Ω filter is 1 µm/eV, for example, for an electron beam with an accelerating voltage of 200 kV.

FIGS. 29 and 30 show a conventional in-column energy filter and one example of optical system positioned ahead of and behind the filter. FIG. 29 shows a state in which the achromatic plane A2 is focused onto a screen 1022. FIG. 30 shows a state in which the energy dispersive plane S2 is focused onto the screen 1022.

Normally, four stages of intermediate lenses 1004, 1006, 1008, and 1010 are positioned between an Ω (omega) filter 1011 and an objective lens 1002. The four stages of intermediate lenses 1004, 1006, 1008, and 1010 adjust a system having four degrees of freedom, i.e., magnification, image rotation, image focus, and crossover focus. The four stages of intermediate lenses 1004, 1006, 1008, and 1010 are so adjusted that a crossover is focused at the entrance crossover plane S1 and that an image is focused at the entrance image plane A1.

Three stages of projector lenses 1016, 1018, and 1020 are disposed behind the omega filter 1011. An energy loss image and an energy spectrum can be obtained by adjusting the excitations of the three stages of projector lenses 1016, 1018, and 1020 to switch the plane focused onto the screen 1022. In particular, in order to produce and observe the energy loss image, the achromatic plane A2 is focused onto the screen 1022 by the three stages of projector lenses 1016, 1018, and 1020 as shown in FIG. 29. In order to obtain the energy spectrum, the energy dispersive plane S2 is focused onto the screen 1022 by the three stages of projector lenses 1016, 1018, and 1020 as shown in FIG. 30. A case in which the three stages of projector lenses 1016, 1018, and 1020 are arranged behind the omega filter 1011 has been described. Alternatively, there may be only two stages of projector lenses.

An energy slit 1014 is used to select only electrons having a certain loss energy. Because of this operation, an energy-filtered (EF) TEM image corresponding to the loss energy can be obtained.

An entrance aperture 1012 is used to restrict a field of view incident on the omega filter 1011. Because of this operation, a spectrum less affected by the effects of aberrations can be obtained. It is to be noted that the performance of EF-TEM (energy-filtered-transmission-electron microscopy) is determined by the aberrations in the omega filter and the optics located ahead of and behind the omega filter.

FIG. 31 illustrates the distance L between the crossover plane S and the image plane A. In cases where it is not necessary to make a distinction between the entrance crossover plane S1 and the energy dispersive plane S2, they are hereinafter referred to as crossover plane S. Similarly, where it is not necessary to distinguish between the entrance image plane A1 and the achromatic plane A2, they are referred to as image plane A.

Where the distance L is large, angular apertures α and β can be made small. This is advantageous in reducing the aberrations in the image plane. However, if the distance L is increased much, the performance will not be improved proportionately for the following reason.

The aberration coefficients of the omega filter are determined by determining the shapes and arrangement of the magnets of the omega filter for a given distance L. However, there are complex intercorrelations among the shapes of the magnets, their arrangement, and the aberration coefficients. The degree of complexity is in proportion to the number of the magnets. In many cases, the aforementioned advantages are canceled out or there occur disproportionate increases in the aberration coefficients.

If the instrument is so designed that the aberrations at the image plane are small, the aberrations at the energy dispersive plane normally tend to deteriorate, and the vice versa.

Other conceivable method is to increase the distance L by increasing the size of the energy filter itself. This method produces the advantage that energy dispersion can be increased proportionately. Unfortunately, the aberration coefficients increase in proportion to the size of the energy filter, thus canceling out the above-described merits regarding the aberrations at the image plane. As a result, anticipated advantages cannot be had. Furthermore, there are disadvantages including increase of the size of the instrument, increase of the weight of the instrument, and cost increases. In addition, if energy dispersion is excessive, low-magnification imaging is required in order to perform electron energy loss spectroscopy (EELS) in the energy range of thousands of eV. In this case, spectra may be distorted.

In this way, in designing the omega filter, computations are performed taking account of various factors (such as the mechanical size, the balance of second-order aberrations between the crossover plane S and the image plane A, and the connection with the optics positioned ahead of and behind the filter), and the instrument is optimized. Some of the second-order aberrations in the omega filter are canceled out by the symmetry. The remaining aberrations appear as distortion and blurs in both crossover plane S and image plane A. FIG. 32 shows the aberrations appearing at the image plane A of the energy filter. FIG. 33 shows the aberrations appearing at the crossover plane (slit plane) S of the energy filter.

Aberration correcting omega filters for canceling the aberrations shown in FIGS. 32 and 33 are disclosed in the afore-cited JP-A-2000-30645 and JP-A-7-37536. However, these prior art aberration correcting omega filters must have additional component parts for aberration correction and thus are made complex in structure.

SUMMARY OF THE INVENTION

The present invention has been made in view of the foregoing problems. One object associated with some aspects of the present invention is to provide an energy filter which can be simplified in structure and which can achieve low aberrations. Another object associated with some aspects of the invention is to provide a charged particle beam system including this energy filter.

(1) An energy filter associated with the present invention includes a first sector magnet and a second sector magnet for producing deflecting magnetic fields to deflect a charged particle beam. The first and second sector magnets are configured mirror-symmetrically with respect to a symmetry plane. The first and second sector magnets are identical in polarity. The first and second sector magnets together constitute an optical system for focusing a crossover and an image. It is assumed that the charged particle beam travels in a Z direction, the charged particle beam is deflected by the deflecting magnetic fields in an X direction, and the deflecting magnetic fields produce lines of magnetic force lying in a Y direction. Except for focusing at a first entrance crossover plane, there are one focal point of the crossover in the X direction and one focal point of the crossover in the Y direction. If the first entrance crossover plane is excluded, the focal point of the crossover in the X direction and the focal point of the crossover in the Y direction are at an energy dispersive plane. Except for focusing at the first entrance image plane, there are two focal points of the image in the X direction and two focal points of the image in the Y direction. If the first entrance image plane is excluded, the focal points of the image in the X direction and the focal points of the image in the Y direction are at the symmetry plane and at an achromatic plane. A real image is formed at the position of the symmetry plane when the first-mentioned image is focused in the X and Y directions. The entrance crossover plane and the energy dispersive plane are positioned mirror-symmetrically with respect to the symmetry plane. The entrance image plane and the achromatic plane are positioned mirror-symmetrically with respect to the symmetry plane.

In this energy filter, low aberrations can be accomplished without using an aberration corrector. Consequently, this energy filter can be simplified in structure and achieve low aberrations.

(2) In one feature of the energy filter of (1) above, the sum of the angle of deflection through which the charged particle beam is deflected in the first sector magnet and the angle of deflection through which the beam is deflected in the second sector magnet may be in a range of from 90 degrees to 210 degrees, inclusively.

In this energy filter, increases in the height of the instrument can be suppressed.

(3) In one feature of the energy filter of (1) or (2) above, the sum of the angle of deflection through which the charged particle beam is deflected in the first sector magnet and the angle of deflection through which the beam is deflected in the second sector magnet is 180 degrees. Each of the first and second sector magnets has two mutually opposite polepiece surfaces. The two opposite polepiece surfaces of the first sector magnet are parallel to each other. The two opposite polepiece surfaces of the second sector magnet are parallel to each other. The distance L between the energy dispersive plane and the achromatic plane may satisfy the relation: L>3.6 R, where R is the radius of a central trajectory of the charged particle beam in the second sector magnet.

This energy filter can be simplified in structure. Furthermore, this energy filter can achieve low aberrations.

(4) In another feature of the energy filter of (1) or (2) above, the sum of the angle of deflection through which the charged particle beam is deflected in the first sector magnet and the angle of deflection through which the beam is deflected in the second sector magnet is 90 degrees. Each of the first and second sector magnets has two mutually opposite polepiece surfaces. The two opposite polepiece surfaces of the first sector magnet are parallel to each other. The two opposite polepiece surfaces of the second sector magnet are parallel to each other. The distance L between the energy dispersive plane and the achromatic plane may satisfy the relation: L>3.2 R, where R is the radius of a central trajectory of the charged particle beam in the second sector magnet.

This energy filter can be simplified in structure. Furthermore, this energy filter can achieve low aberrations.

(5) In one feature of the energy filter of any one of (1)-(4) above, the first sector magnet may be divided into a plurality of segments. Also, the second sector magnet may be divided into a plurality of segments.

(6) Another energy filter associated with the present invention comprises a sector magnet for producing a deflecting magnetic field to deflect a charged particle beam. The sector magnet is configured mirror-symmetrically with respect to a symmetry plane. The sector magnet constitutes an optical system that focuses a crossover and an image. It is assumed that the charged particle beam travels in a Z direction, the charged particle beam is deflected in an X direction by the deflecting magnetic field, and the deflecting magnetic field produces lines of magnetic force lying in a Y direction. Except for focusing at a first entrance crossover plane, there are one focal point of the crossover in the X direction and one focal point of the crossover in the Y direction. If the first entrance crossover plane is excluded, the focal point of the crossover in the X direction and the focal point in the Y direction are at an energy dispersive plane. Except for focusing at the first entrance image plane, there are two focal points of the image in the X direction and two focal points of the image in the Y direction. If the first entrance image plane is excluded, the focal points of the image in the X direction and the focal points of the image in the Y direction are at the symmetry plane and at an achromatic plane. A real image is formed at the position of the symmetry plane when the first-mentioned image is focused in the X and Y directions. The entrance crossover plane and the energy dispersive plane are positioned mirror-symmetrically with respect to the symmetry plane. The entrance image plane and the achromatic plane are positioned mirror-symmetrically with respect to the symmetry plane.

In this energy filter, low aberrations can be accomplished without using an aberration corrector. Consequently, this energy filter can be simplified in structure and achieve low aberrations.

(7) In one feature of the energy filter of (6) above, the sector magnet may have two mutually opposite polepiece surfaces which are tilted at an angle of tilt and not parallel to each other. The angle of tilt may satisfy a round lens focus condition.

(8) In one feature of the energy filter of (7) above, the charged particle beam is deflected through an angle of 180 degrees in the sector magnet. The distance L between the energy dispersive plane and the achromatic plane may satisfy the relation: L>3.5 R, where R is the radius of a central trajectory of the charged particle beam in the sector magnet.

This energy filter can be simplified in structure. Furthermore, this energy filter can achieve low aberrations.

(9) In another feature of the energy filter of (7) above, the charged particle beam is deflected through an angle of 90 degrees in the sector magnet. The distance L between the energy dispersive plane and the achromatic plane may satisfy the relation: L>3.3 R, where R is the radius of a central trajectory of the charged particle beam in the sector magnet.

This energy filter can be simplified in structure. Furthermore, this energy filter can achieve low aberrations.

(10) A charged particle beam system associated with the present invention includes an energy filter of any one of (1)-(9) above.

Because this charged particle beam system includes an energy filter associated with the present invention, a high-performance charged particle beam system can be accomplished at low cost.

(11) In one feature of the charged particle beam system of (10) above, there may be further included an intermediate lens system and a projector lens system. The energy filter may be disposed between the intermediate lens system and the projector lens system.

In this charged particle beam system, because of the symmetry of the structure of the energy filter, some of aberrations produced from the energy filter itself cancel each other out and, therefore, it is not necessary to correct these aberrations. Furthermore, in this charged particle beam system, the projector lens system permits a switch to be made easily between imaging mode and spectroscopy mode. In addition, this charged particle beam system can accommodate itself to imaging done with a wide field of view from low to high magnifications because filtering is done by the energy filter prior to magnification by the projector lens system.

(12) In one feature of the charged particle beam system of (11) above, the intermediate lens system may bring a diffraction pattern of a sample into focus at the entrance crossover plane of the energy filter and bring an image of the sample into focus at the entrance image plane of the energy filter.

(13) In another feature of the charged particle beam system of (11) above, the intermediate lens system may bring an image of a sample into focus at the entrance crossover plane of the energy filter and bring a diffraction pattern of the sample into focus at the entrance image plane of the energy filter.

BRIEF DESCRIPTION OF THE DRAWINGS

FIG. 8 is a table showing the results of computations of the aberration coefficients of U-type and ΩB-type.

FIG. 9 is a table showing optical conditions under which aberrations of the U-type and ΩB-type are computed and the results of computations of aberrations.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

Also, in the following description, an electron microscope for observing a sample by irradiating it with an electron beam is taken as one example of a charged particle beam system associated with the present invention. The charged particle beam system associated with the present invention may be any instrument for observing a sample by irradiating it with a charged particle beam (such as ions) other than an electron beam. Examples of the charged particle beam system associated with the present invention include transmission electron microscope (TEM) and scanning transmission electron microscope (STEM).

1. ENERGY FILTER AND ELECTRON MICROSCOPE

Figure 1:
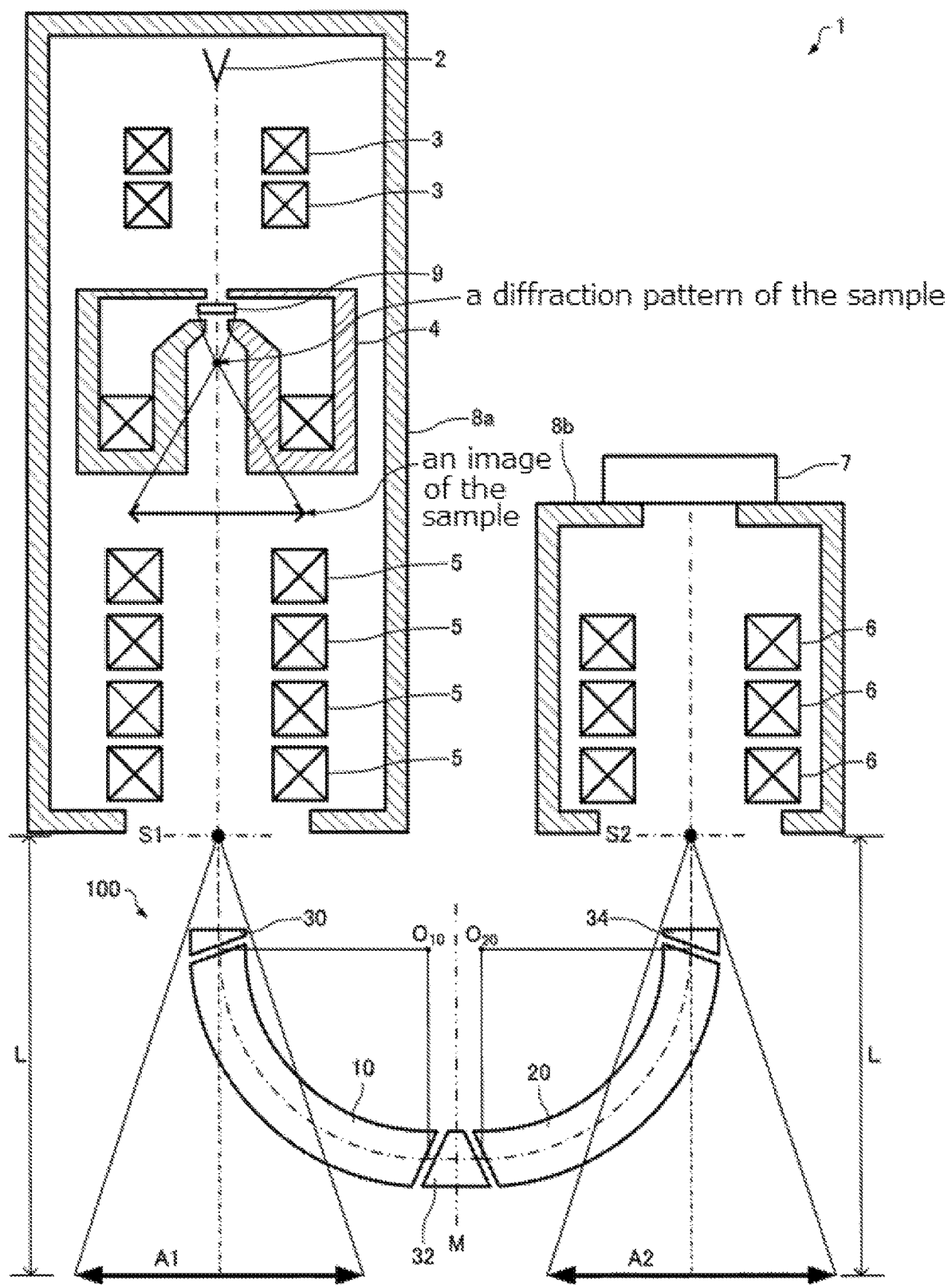
FIG. 1 is a schematic view of an electron microscope equipped with an energy filter associated with one embodiment of the present invention.

First, an energy filter, 100, associated with the present embodiment is described by referring to FIG. 1, which schematically shows an electron microscope 1 equipped with the energy filter 100. The electron microscope 1 is a transmission electron microscope (TEM).

As shown in FIG. 1, the electron microscope 1 is configured including an electron source 2, an illumination lens system 3, an objective lens 4, an intermediate lens system 5, the energy filter 100, a projector lens system 6, and an imager 7.

The electron source 2 produces electrons. For example, the electron source 2 is an electron gun in which electrons emitted from a cathode are accelerated by an anode such that an electron beam is emitted from the gun.

The illumination lens system 3 operates such that the electron beam emitted from the electron source 2 is focused onto a sample 9. The illumination lens system 3 is made up of a plurality of electron lenses, for example.

The objective lens 4 is an initial stage of lens for creating a transmission electron microscope (TEM) image from the electron beam transmitted through the sample 9. The objective lens 4 has polepieces for applying a strong magnetic field to the sample 9. The sample 9 is placed inside the polepieces.

The TEM image referred to herein is an image of the sample or a diffraction pattern of the sample. Where the TEM image is an image of the sample, a crossover is a diffraction pattern of the sample. Where the TEM image is a diffraction pattern of the sample, a crossover is an image of the sample. The TEM image (or simply image) and crossover are used in these meanings.

The intermediate lens system 5 is made up of four stages of intermediate lenses and mounted between the objective lens 4 and the energy filter 100. The four stages of intermediate lens system 5 permit adjustments of magnification, image rotation, image focusing, and crossover focusing. The four-stage intermediate lens system 5 brings a crossover into focus at the entrance crossover plane S1 of the energy filter 100 and brings an image into focus at the entrance image plane A1.

Where a sample image is observed with the electron microscope 1 in the imaging mode, the intermediate lens system 5 brings a diffraction pattern of the sample 9 into focus at the entrance crossover plane S1 of the energy filter 100 and brings an image of the sample 9 into focus at the entrance image plane A1 of the filter 100. Where a diffraction pattern of the sample 9 is observed with the electron microscope 1 in the electron diffraction mode, the intermediate lens system 5 brings an image of the sample 9 into focus at the entrance crossover plane S1 of the energy filter 100 and brings a diffraction pattern of the sample 9 into focus at the entrance image plane A1 of the filter 100.

The energy filter 100 is positioned between the intermediate lens system 5 and the projector lens system 6. The electron microscope 1 may have an entrance aperture (not shown) for limiting the field of view incident on the energy filter 100. The energy filter 100 is an in-column energy filter (imaging energy filter). The trajectory of electrons passing through the energy filter 100 assumes a U-shaped form. That is, the total deflection angle of the electron beam is 180 degrees.

The optical system of the energy filter 100 includes the entrance crossover plane S1, entrance image plane A1, energy dispersive plane (exit crossover plane) S2, and achromatic plane (exit image plane) A2.

The crossover is focused at the entrance crossover plane S1 by the intermediate lens system 5. The image is focused at the entrance image plane A1 by the intermediate lens system 5. The energy filter 100 has a focusing action similarly to an electron lens. The entrance crossover plane S1 is projected onto the energy dispersive plane S2. The entrance image plane A1 is projected onto the achromatic plane A2.

Energy dispersion occurs at the energy dispersive plane S2. The crossover is focused at the energy dispersive plane S2. The energy dispersive plane S2 is so formed that the entrance crossover plane S1 and the energy dispersive plane S2 are positioned mirror-symmetrically with respect to the symmetry plane M.

No energy dispersion occurs at the achromatic plane A2. The image is focused at the achromatic plane A2. The achromatic plane A2 is so formed that the entrance image plane A1 and the achromatic plane A2 are positioned mirror-symmetrically with respect to the symmetry plane M. An energy slit (not shown) is disposed at the energy dispersive plane S2. Only electrons having a certain loss energy are selected by the energy slit. As a result, an energy-filtered TEM (EF-TEM) image corresponding to the loss energy can be obtained.

The energy filter 100 is configured including a first sector magnet 10 and a second sector magnet 20. In the energy filter 100, the second sector magnet 20 is disposed behind (on the downstream side relative to the direction of travel of the electron beam) the first sector magnet 10. The first sector magnet 10 and second sector magnet 20 produce their respective deflecting magnetic fields for deflecting the electron beam. The first sector magnet 10 and second sector magnet 20 together constitute an optical system for focusing the crossover and the image.

The first sector magnet 10 and the second sector magnet 20 are configured symmetrically with respect to the symmetry plane M. That is, the deflecting magnetic fields respectively set up by the first sector magnet 10 and the second sector magnet 20 are symmetric with respect to the symmetry plane M.

The first sector magnet 10 and second sector magnet 20 are curved. The first sector magnet 10 is shaped in the form of a sector about its center O10 as shown in FIG. 1 and has a central angle of 90 degrees. Similarly, the second sector magnet 20 is shaped in the form of a sector about its center O20 as also shown in FIG. 1 and has a central angle of 90 degrees.

The direction of travel of the electron beam is rotated through 90 degrees by the first sector magnet 10. Similarly, the direction of the travel of the electron beam is rotated through 90 degrees by the second sector magnet 20. That is, the angle of deflection of the electron beam in the first sector magnet 10 is 90 degrees. Similarly, the angle of deflection of the electron beam in the second sector magnet 20 is 90 degrees.

The sum of the angle of deflection of the electron beam in the first sector magnet 10 and the angle of deflection of the electron beam in the second sector magnet 20 is 180 degrees. Accordingly, the electron beam incident on the energy filter 100 is rotated through 180 degrees, i.e., inverted, and then leaves the filter. That is, the central trajectory (optical axis) of the electron beam incident on the energy filter 100 and the central trajectory (optical axis) of the electron beam emerging from the energy filter 100 are parallel to each other.

The first sector magnet 10 and the second sector magnet 20 are identical in polarity. The polarity referred to herein indicates the sense of lines of magnetic force of a deflecting magnetic field. That is, the lines of magnetic force of the deflecting magnetic field generated by the first sector magnet 10 and the lines of magnetic force of the deflecting magnetic field generated by the second sector magnet 20 are identical in sense.

Figure 5:
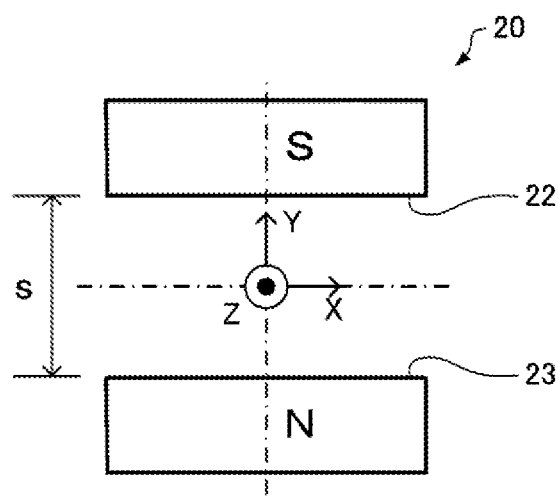
FIGS. 5 and 6 are schematic cross sections of the second sector magnet of the energy filter shown in FIG. 4.

In the example of FIG. 5 described later, the lines of magnetic force (magnetic field) produced by the second sector magnet 20 lie in the Y direction. The sense of the lines of magnetic force is in the +Y direction. Because the first sector magnet 10 and the second sector magnet 20 are identical in polarity, the sense of the lines of magnetic force produced from the first sector magnet 10 is also in the +Y direction. In the example shown in FIG. 5, a polepiece surface 22 is an S pole, while an opposite polepiece surface 23 is an N pole.

A shunt 30 is mounted at the entrance of the first sector magnet 10. Another shunt 32 is mounted at the exit of the first sector magnet 10 and also at the entrance of the second sector magnet 20. A shunt 34 is mounted at the exit of the second sector magnet 20. In the illustrated example, the common shunt 32 is mounted between the exit of the first sector magnet 10 and the entrance of the second sector magnet 20. The shunts 30, 32, and 34 attenuate the deflecting magnetic fields produced by the sector magnets 10 and 20, thereby preventing leakage of the deflecting magnetic fields out of the sector magnets 10 and 20.

The projector lens system 6 is made up of three stages of lenses and mounted behind (i.e., on the downstream side relative to the direction of travel of the electron beam) the energy filter 100. The plane focused onto the imager 7 can be switched by adjusting the excitations of the three-stage projector lens system 6. Consequently, both energy-loss image and energy spectrum can be obtained. In particular, in order to provide energy loss imaging, the achromatic plane A2 of the energy filter 100 is focused onto the imager 7 by the three-stage projector lens system 6. In order to derive an energy spectrum, the energy dispersive plane S2 of the energy filter 100 is focused onto the imager 7 by the three-stage projector lens system 6.

A case in which the three-stage projector lens system 6 is arranged behind the energy filter 100 has been described herein. The projector lens system 6 may be made up of two stages of projector lenses.

The imager 7 captures an energy loss image, an energy spectrum, a TEM image, or the like focused by the projector lens system 6. The imager 7 is a digital camera such as a CCD camera or a CMOS camera, for example.

The electron microscope 1 has two electron optical columns 8a and 8b. The electron source 2, illumination lens system 3, objective lens 4, and intermediate lens system 5 are accommodated in the electron optical column 8a. The projector lens system 6 is accommodated in the electron optical column 8b. The electron optical columns 8a and 8b are juxtaposed in a parallel relation on a pedestal (not shown). In the electron microscope 1, the energy filter 100 is disposed in the portion which interconnects the two electron optical columns 8a and 8b.

In the electron microscope 1, the electron beam emitted from the electron source 2 is focused onto the sample 9 by the illumination lens system 3. The electron beam hitting the sample 9 is transmitted through the sample 9 and focused by the objective lens 4. The crossover is focused at the entrance crossover plane S1 by the intermediate lens system 5. The image is focused at the entrance image plane A1. In the energy filter 100, the crossover focused at the entrance crossover plane S1 is projected onto the energy dispersive plane S2. The image focused at the entrance image plane A1 is projected onto the achromatic plane A2. An energy loss image can be observed by focusing the achromatic plane A2 onto the imager 7 by the projector lens system 6. Furthermore, an energy spectrum can be obtained by focusing the energy dispersive plane S2 onto the imager 7 by the projector lens system 6.

Figure 2:
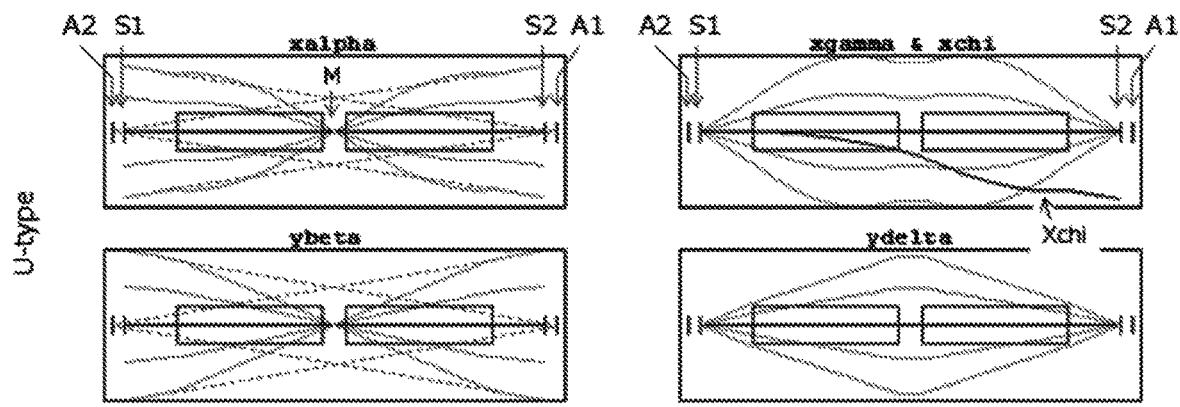
FIG. 2 is a diagram illustrating trajectories of an electron beam in the energy filter of FIG. 1.
Figure 3:
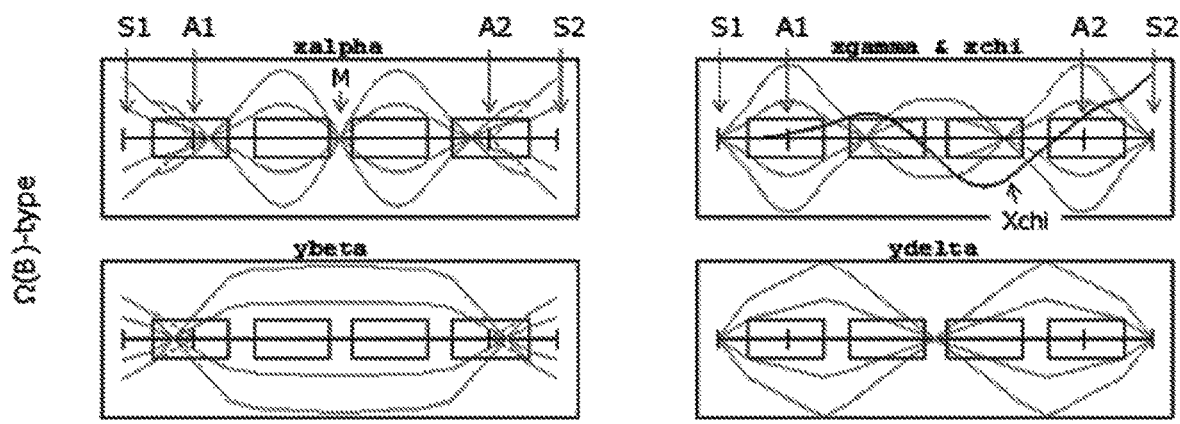
FIG. 3 is a diagram illustrating trajectories of an electron beam in a B-type omega filter.

The energy filter 100 associated with the present embodiment is next described in further detail. FIG. 2 is a diagram illustrating trajectories of the electron beam in this energy filter 100. FIG. 3 is a diagram illustrating as a comparative example trajectories of an electron beam in an omega filter (B-type). Although the center axis (optical axis) of the energy filter is curved, the axis is drawn as a straight line for the sake of convenience in FIGS. 2 and 3.

In FIGS. 2 and 3, there are shown four fundamental trajectories $x\alpha$, $y\beta$, $x\gamma$, and $y\delta$ of rays of the electron beam in the energy filter. The trajectories $x\alpha$ and $y\beta$ pass through the center of the image plane. The trajectories $x\gamma$ and $y\delta$ pass through the center of a crossover plane. $x\chi$ ($\xi$) indicates the trajectory of energy-dispersed electrons.

In the trajectory $x\gamma$ within the energy filter 100 shown in FIG. 2, the crossover focused at the entrance crossover plane S1 by the intermediate lens system 5 is focused at the energy dispersive plane S2. In the trajectory $y\delta$, the crossover focused at the entrance crossover plane S1 by the intermediate lens system 5 is focused at the energy dispersive plane S2 in the same way as for the trajectory $x\gamma$.

That is, in the energy filter 100, except for focusing at the first entrance crossover plane S1, there is only one focal point of the crossover in the X direction. Except for focusing at the first entrance crossover plane S1, there is only one focal point of the crossover in the Y direction. Furthermore, if the first entrance crossover plane S1 is excluded, the focal point of the crossover in the X direction and the focal point of the crossover in the Y direction are at the energy dispersive plane S2.

Furthermore, in the trajectory $x\alpha$ within the energy filter 100, the image focused at the entrance image plane A1 by the intermediate lens system 5 is focused at the symmetry plane M and at the achromatic plane A2. In the trajectory $y\beta$, the image focused at the entrance image plane A1 by the intermediate lens system 5 is focused at the symmetry plane M and at the achromatic plane A2.

That is, in the energy filter 100, except for focusing at the first entrance image plane A1, there are two focal points of the image in the X direction. Except for focusing at the first entrance image plane A1, there are two focal points of the image in the Y direction. Furthermore, where the first entrance image plane A1 is excluded, the focal points of the image in the X and Y directions are at the symmetry plane M and at the achromatic plane A2. When the image is focused in the X and Y directions, a real image is formed at the position of the symmetry plane M. The images focused onto the entrance image plane A1 and onto the achromatic plane A2 are virtual images. In the trajectories $x\alpha$ and $y\beta$, the focal points are the intersections of a straight line being an extension of the electron trajectory indicated by the broken line with the optical axis.

On the other hand, in the omega filter (B-type) shown in FIG. 3, there are three focal points of the crossover in the X direction (see the trajectory $x\gamma$). The focal points of the crossover in the X direction are three intersections of the trajectory $x\gamma$ with the optical axis of the filter. Furthermore, in the omega filter (B-type), there are two focal points of the image in the X direction (see trajectory $x\alpha$). The focal points of the image in the X direction are at the symmetry plane M and at the achromatic plane A2. The focal points of the crossover and the focal points of the image in the Y direction are fewer in number by one than in the X direction (see the trajectories $y\delta$ and $y\beta$).

In this way, in the omega filter (B-type), the focal points of the crossover in the Y direction and the focal points of the image in the Y direction are fewer in number by one than in the X direction. Therefore, in the omega filter (B-type), the image is inverted. Furthermore, in the omega filter (B-type), the number of focal points in the Y direction is reduced. This suppresses increases in the angle of the polepiece end surfaces required for focusing. As a result, the resultant aberrations are suppressed.

On the other hand, in the energy filter 100, as described previously, the number of focal points is identical for both X and Y directions and so there is no inversion of the image unlike in the omega filter (B-type).

Figure 4:
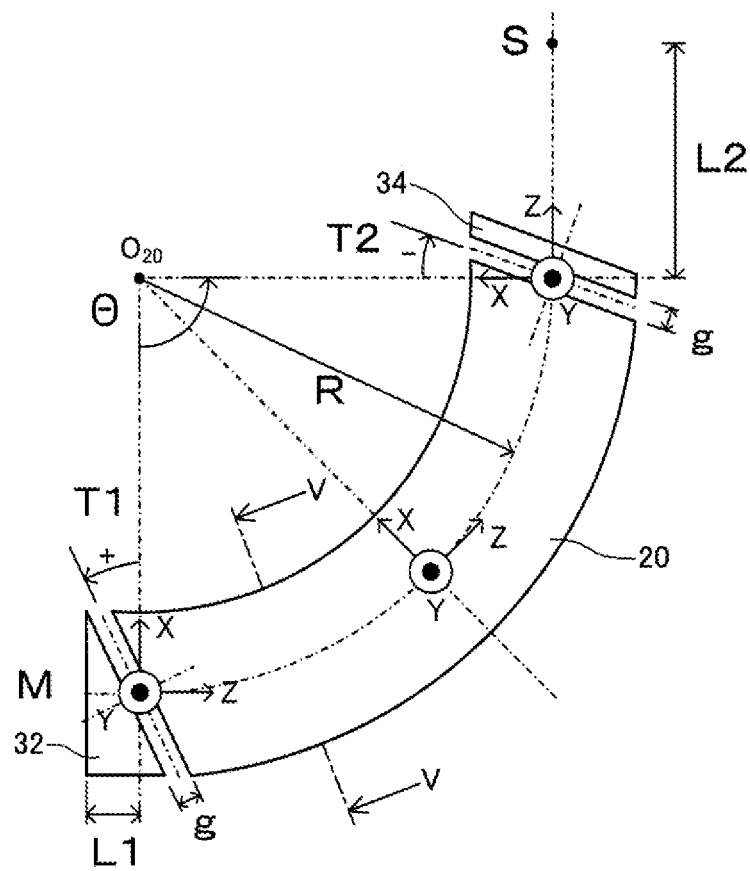
FIG. 4 is a schematic diagram of the second sector magnet of the energy filter shown in FIGS. 1 and 2.
Figure 6:
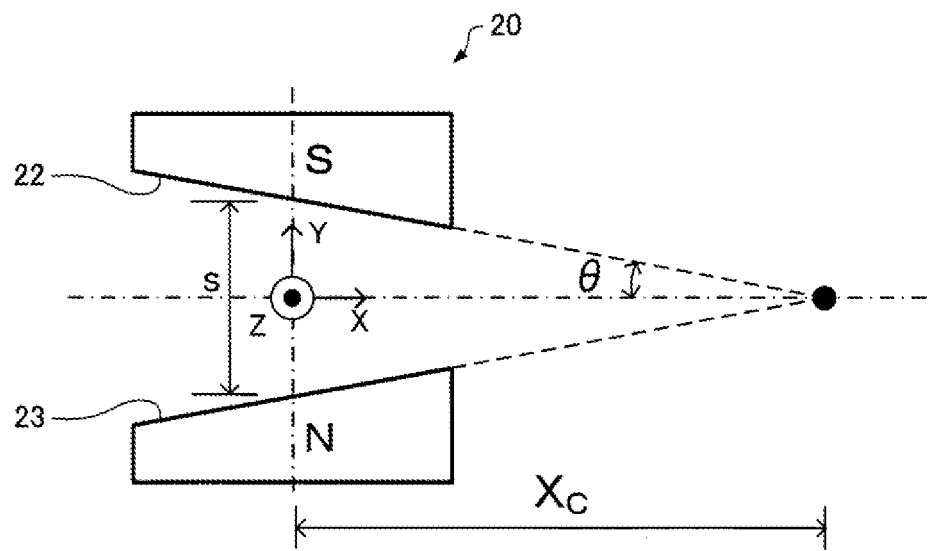

The configuration of the second sector magnet 20 is next described by referring to FIGS. 4-6. Since the first sector magnet 10 and the second sector magnet 20 are designed symmetrically, the first sector magnet 10 is similar in configuration to the second sector magnet 20.

FIGS. 4-6 are schematic diagrams of the second sector magnet 20 of the energy filter 100 associated with the present embodiment. FIG. 5 is a cross-sectional view of the second sector magnet 20 of FIG. 4, taken on line V-V. FIG. 6 shows a modified example of the second sector magnet 20.

In particular, FIG. 5 shows a state in which polepiece surfaces 22 and 23 of the second sector magnet 20 which are opposite to each other in the Y direction are not tilted (i.e., have a tilt angle θ of 0°). FIG. 6 shows a state in which the opposite polepiece surfaces 22 and 23 of the second sector magnet 20 are tilted (i.e., the tilt angle θ≠0°).

In FIGS. 4-6, X, Y, and Z axes are shown as three mutually orthogonal axes. It is assumed that electrons travel in the Z direction, the electrons are deflected in the X direction by the deflecting magnetic fields, and the lines of force of the deflecting magnetic fields lie in the Y direction.

In order to focus the crossover and image in the X and Y directions, four degrees of freedom are needed. If the distance between the crossover plane S (energy dispersive plane S2) and the image plane (achromatic plane A2) is L, or if an equivalent distance between the entrance crossover plane S1 and the entrance image plane A1 is L (see FIG. 1), focus parameters (distance L1, distance L2, end surface angle T1, and end surface angle T2) are calculated. Since the energy filter 100 is simple in structure, there are no other focus parameters than these four parameters (distances L, L2, and end surface angles T1, T2). Therefore, if the distance L is given, the distance L1, distance L2, end surface angle T1, and end surface angle T2 are determined uniquely. The tilt angle θ of the opposite polepiece surfaces 22 and 23 can be another focus parameter, but this is not taken into consideration herein.

The distance L is taken between the symmetry plane M and the entrance of the second sector magnet 20. The entrance of the second sector magnet 20 is the midpoint between the entrance end surface of the second sector magnet 20 and the shunt 32 on the central trajectory of the electron beam.

The distance L2 is taken between the exit of the second sector magnet 20 and the crossover plane S (energy dispersive plane S2). The exit of the second sector magnet 20 is the midpoint between the exit-side end surface of the second sector magnet 20 and the shunt 34 on the central trajectory of the electron beam.

The end surface angle T1 is the angle of the end surface of the second sector magnet 20 on the entrance side. The end surface angle T2 is the angle of the end surface of the second sector magnet 20 on the exit side. The end surface angles T1 and T2 are so defined that the X axis is at 0° and that a counterclockwise direction is the positive direction. The use of the end surface angles T1 and T2 can produce a focusing action in the Y direction. However, if the end surface angles T1 and T2 are large, aberrations tend to increase.

Figure 7:
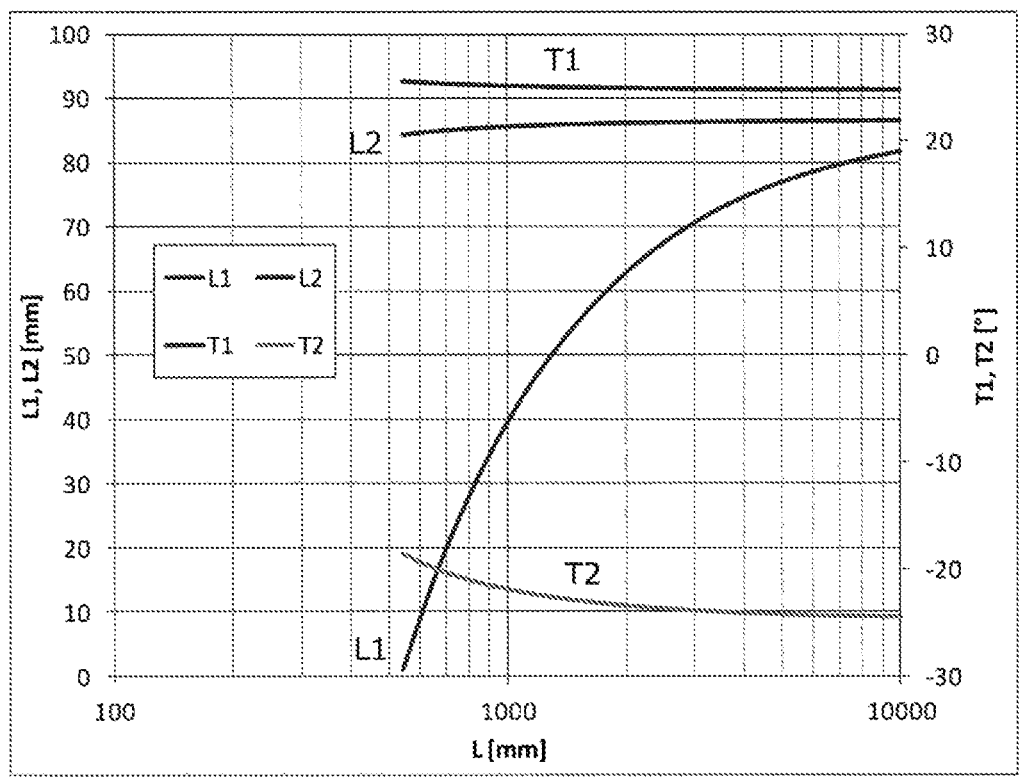
FIG. 7 is a graph in which focus parameters are plotted against distance L.

FIG. 7 is a graph in which the focus parameters (distance L1, distance L2, end surface angle T1, and end surface angle T2) are plotted against the given distance L. The graph of FIG. 7 shows the results of computations of the distance L1, distance L2, end surface angle T1, and end surface angle T2 for the given distance L on the assumption that the deflection radius R=150 mm, the deflection angle Θ=90°, and the tilt angle θ=0°.

The deflection radius R is the radius of the central trajectory of the electron beam in the second sector magnet 20. The deflection angle Θ is the deflection angle of the electron beam in the second sector magnet 20. The tilt angle θ (see FIG. 6) is the tilt angle of the opposite polepiece surfaces 22 and 23 of the second sector magnet 20. Since the tilt angle θ=0° at this time, the opposite polepiece surfaces 22 and 23 are parallel to each other as shown in FIG. 5.

The graph of FIG. 7 shows that if it is assumed that the deflection radius R=150 mm, the deflection angle Θ=0°, and the tilt angle θ=0°, then the range of the distance L in which the crossover and the image can be focused in the X and Y directions as shown in FIG. 2 in the energy filter 100 is greater than 538 mm. That is, the distance L can be set within the range: L>3.6 R (see Table 1).

The graph of FIG. 7 also shows that if the deflection radius R=150 mm, the deflection angle Θ=90°, and the tilt angle θ=0°, then the distance L2 is in the range of from 80 mm to 90 mm, the end surface angle T1 is in the range of from 24° to 26°, the end surface angle T2 is in the range of from −25° to −18°, and the distance L1 is in the range of from 0 mm to L2.

Where the opposite polepiece surfaces 22 and 23 of the second sector magnet 20 are tilted, i.e., tilt angle θ≠0°, as shown in FIG. 6, or where a magnetic quadrupole is placed in at least one of the entrance and exit of the second sector magnet 20 (see FIGS. 16 and 18 referenced later), a focusing action can be produced in the Y direction. Therefore, the end surface angles T1 and T2 can be reduced. Consequently, the end surface angles T1 and T2 are not restricted to the foregoing ranges.

The end surface angles T1 and T2 can be reduced to a minimum when the second sector magnet 20 produces the same focusing action at all times for both X and Y directions, i.e., when the round lens focus condition is met. At this time, the equality, distance Xc=2 R, is satisfied. That is, tan θ=s/4 R. The range of the deflection angle Θ occurring at this time is theoretically determined. When only a magnetic field is present, 2Θ<254°. When only an electric field is present, 2Θ<180°. In the case of a round lens focus, the end surface angles T1=T2=0°. The range of the distance L in which focusing is possible is not restricted to the above-described range (see Table 1).

The distance Xc is taken between the position at which a plane containing one opposite polepiece surface 22 and a plane containing the other opposite polepiece surface 23 intersect and the central trajectory of the electron beam in the second sector magnet 20 as viewed from the Z direction as shown in FIG. 6. The spacing distance s is taken between the mutually opposite polepiece surfaces 22 and 23 in the YZ plane.

In the second sector magnet 20, the focusing action in the X direction and the focusing action in the Y direction are allowed to differ in intermediate positions if both actions agree in the final focal plane. This is referred to as a stigmatic focus.

The range of the distance L depends on both deflection angle Θ and tilt angle θ of the mutually opposite polepiece surfaces 22 and 23. In the case of a modified example (FIGS. 20-23) described later, 2Θ=90°, 2Θ=135°, 2Θ=180°, and 2Θ=210°. The minimum value of the distance L at which the crossover and image can be brought to focus in the X and Y directions is given in the following Table 1 under the condition where the deflection radius R=150 mm.

TABLE 1

| 2Θ | R/Xc = 0 stigmatic focus | R/Xc = ½ round lens focus |
|---|---|---|
| 90° | 478.4 mm (≈3.19R) | 490.9 mm (≈3.27R) |
| 135° | 415.0 mm (≈2.77R) | 430.6 mm (≈2.87R) |
| 180° | 538.4 mm (≈3.59R) | 526.2 mm (≈3.51R) |
| 210° | 1018.0 mm (≈6.79R) | 780.4 mm (≈5.20R) |

As shown in Table 1, under the condition of the stigmatic focus (R/Xc=0), if 2Θ=90° and the tilt angle θ=0°, the range of the distance L at which focusing is possible is above the distance L=478.4 mm, i.e., L>3.2 R. If 2Θ=135° and the tilt angle θ=0°, the range of the distance L at which focusing is possible is above the distance L=415.0 mm, i.e., L>2.8 R. If 2Θ=180° and the tilt angle θ=0°, the range of the distance L at which focusing is possible is above the distance L=538.4 mm, i.e., L>3.6 R. If 2Θ=210° and the tilt angle θ=0°, the range of the distance L at which focusing is possible is above the distance L=1018.0 mm, i.e., L>6.8 R.

In the case of the round lens focus (R/Xc=1/2), if 2Θ=90° and the tilt angle θ≠0°, the range of the distance L at which focusing is possible is above the distance L=490.9 mm, i.e., L>3.3 R. If 2Θ=135° and the tilt angle θ≠0°, the range of the distance L at which focusing is possible is above the distance L=430.6 mm, i.e., L>2.9 R. If 2Θ=180° and the tilt angle θ≠#0°, the range of the distance L at which focusing is possible is above the distance L=526.2 mm, i.e., L>3.5 R. If 2Θ=210° and the tilt angle θ≠0°, the range of the distance L at which focusing is possible is above the distance L=780.4 mm, i.e., L>5.2 R.

The configuration of the second sector magnet 20 has been described above. As described previously, the above-mentioned principle also applies to the first sector magnet 10. That is, even in the first sector magnet 10, the distance L between the crossover plane S (entrance crossover plane S1) and the image plane A (entrance image plane A1) satisfies the relation: L>3.6 R, for example. In the first sector magnet 10, the distance L corresponds to the distance between the symmetry plane M and the exit of the first sector magnet 10. The distance L2 corresponds to the distance between the entrance of the first sector magnet 10 and the crossover plane S (entrance crossover plane S1). The end surface angle T1 corresponds to the angle of the end surface on the exit side of the first sector magnet 10. The end surface angle T2 corresponds to the angle of the end surface on the entrance side of the first sector magnet 10.

The energy filter 100 and the electron microscope 1 including the energy filter 100 have the following features. In the energy filter 100, there are one focal point of the crossover in the X direction and one focal point of the crossover in the Y direction except for focusing at the first entrance crossover plane S1. Where the first entrance crossover plane S1 is excluded, the focal point of the crossover in the X direction and the focal point of the crossover in the Y direction are at the energy dispersive plane S2. There are two focal points of the image in the X direction and two focal points of the image in the Y direction except for focusing at the first entrance image plane A1. Where the first entrance image plane A1 is excluded, the focal points of the image in the X direction and the focal points of the image in the Y direction are at the symmetry plane M and at the achromatic plane A2. Therefore, in the energy filter 100, as shown in a working example provided below, low aberrations can be accomplished without using an aberration corrector. Hence, the energy filter 100 can be made simple in structure. Also, the filter can achieve low aberrations.

Furthermore, in the energy filter 100, the first sector magnet 10 and the second sector magnet 20 are configured mirror-symmetrically with respect to the symmetry plane M. Consequently, in the energy filter 100, some aberrations (such as some of second-order geometric aberrations) can be canceled out.

In the energy filter 100, in a case where the radius of the central trajectory of the electron beam in the second sector magnet 20 is R, the deflection angle Θ is 90°, and the tilt angle θ is 0°, the distance L between the energy dispersive plane S2 and the achromatic plane A2 satisfies the relation: L>3.6 R. Similarly, where the radius of the central trajectory of the electron beam in the first sector magnet 10 is R, the distance L between the entrance crossover plane S1 and the entrance image plane A1 satisfies the relation: L>3.6 R. That is, the sum of the deflection angle of the electron beam in the first sector magnet 10 and the deflection angle of the electron beam in the second sector magnet 20 is 180 degrees. The distance L satisfies the relation: L>3.6 R. Therefore, the energy filter 100 can be simplified structurally. Also, the filter can accomplish low aberrations.

In the energy filter 100, in a case where the radius of the central trajectory of the electron beam in the second sector magnet 20 is R, the deflection angle Θ is 45°, and the tilt angle θ is 0°, the distance L between the energy dispersive plane S2 and the achromatic plane A2 satisfies the relation: L>3.2 R. Similarly, where the radius of the central trajectory of the electron beam in the first sector magnet 10 is R, the distance L between the entrance crossover plane S1 and the entrance image plane A1 satisfies the relation: L>3.2 R. That is, the sum of the deflection angle of the electron beam in the first sector magnet 10 and the deflection angle of the electron beam in the second sector magnet 20 is 90°. The distance L satisfies the relation: L>3.2 R. Therefore, the energy filter 100 can be simplified in structure. Also, the filter 100 can accomplish low aberrations.

In the energy filter 100, the sum of the deflection angle of the electron beam in the first sector magnet 10 and the deflection angle of the electron beam in the second sector magnet 20 is 180 degrees. Therefore, in the electron microscope 1, as shown in FIG. 1, the energy filter 100 can be positioned in the portion interconnecting the two electron optical columns 8a and 8b. This can suppress the height of the electron microscope (electron optical columns) from increasing.

Since the electron microscope 1 includes the energy filter 100 which can be made simple in structure and which can accomplish low aberrations, a high-performance electron microscope can be accomplished at low cost. Furthermore, in the electron microscope 1, the energy filter 100 produces low aberrations and so it is not necessary to make aberration corrections. In consequence, axial alignments can be made easily.

In the electron microscope 1, the energy filter 100 is positioned between the intermediate lens system 5 and the projector lens system 6. Therefore, in the microscope 1, because of the symmetry of the structure of the energy filter, some of aberrations produced from the energy filter itself cancel themselves out. Hence, these aberrations do not need to be corrected. Furthermore, in the electron microscope 1, a switch can be easily made between imaging mode and spectroscopy mode by the projector lens system 6. In addition, in the electron microscope 1, filtering is done by the energy filter prior to magnification by the projector lens system and, therefore, it is possible to cope with imaging performed with a wide field of view from low to high magnifications.

2. WORKING EXAMPLE

The present embodiment is further described below by giving a working example. It is to be noted, however, the present invention is not restricted thereby.

In the present working example, aberration coefficients have been calculated using a model in which the energy filter 100 has the deflection angle R=150 mm and the distance L=700 mm. The model of the energy filter 100 used for the calculations is also referred to as "U-type" below.

As a comparative example, the aberration coefficients of an omega filter (B-type) were calculated. A typical model with the distance L=95 mm was used for the omega filter (B-type) of the comparative example. The model for the omega filter (B-type) used for the calculations is also hereinafter referred to as "ΩB-type".

Figure 32:
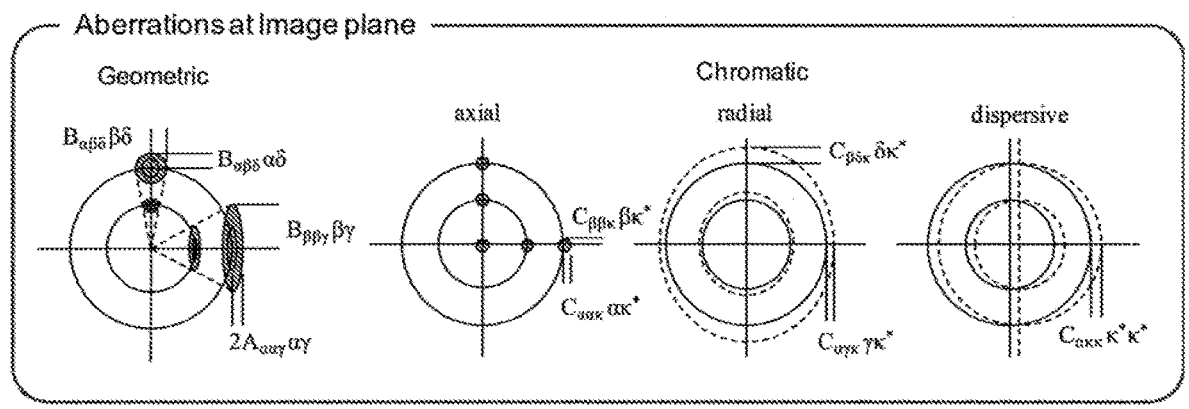
FIG. 32 is a diagram illustrating aberrations appearing at an image plane of an energy filter.
Figure 33:
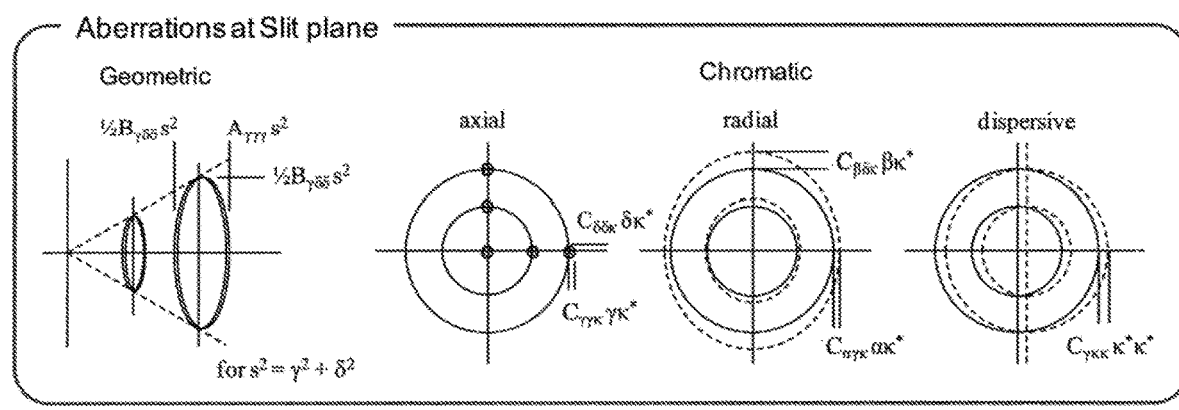
FIG. 33 is a diagram illustrating aberrations appearing at a crossover plane of an energy filter.

FIG. 8 is a table showing the results of calculations of the aberration coefficients of the U-type and ΩB-type. The aberration coefficients in the table of FIG. 8 correspond to the aberration coefficients shown in FIGS. 32 and 33. For example, "A_AAG" indicates "A_ααγ". That is, after an underline (underbar)_, A corresponds to α and G corresponds to γ. Also, B and D correspond to β and δ, respectively.

As shown in FIG. 8, some of the aberration coefficients of the U-type are larger than those of the ΩB-type but the others are smaller. It can be said that the aberration coefficients of the U-type are roughly comparable in magnitude to those of the ΩB-type.

Then, the U-type and ΩB-type are compared in terms of geometric and chromatic aberrations. Chromatic aberration components have been computed under the condition where energy loss width ΔE=50 eV.

FIG. 9 is a table showing the results of optical conditions under which the aberrations of the U-type and ΩB-type have been calculated and the results of the calculations.

The total magnification of the electron microscope is assumed to be 100 k. "M" indicates the magnification from the sample surface to the achromatic plane. "Mp" indicates the magnification from the achromatic plane to the screen (imager), i.e., the magnification of the projector lens system. Since the total magnification of the electron microscope is 100 k, M×Mp is 100 k.

Figure 31:
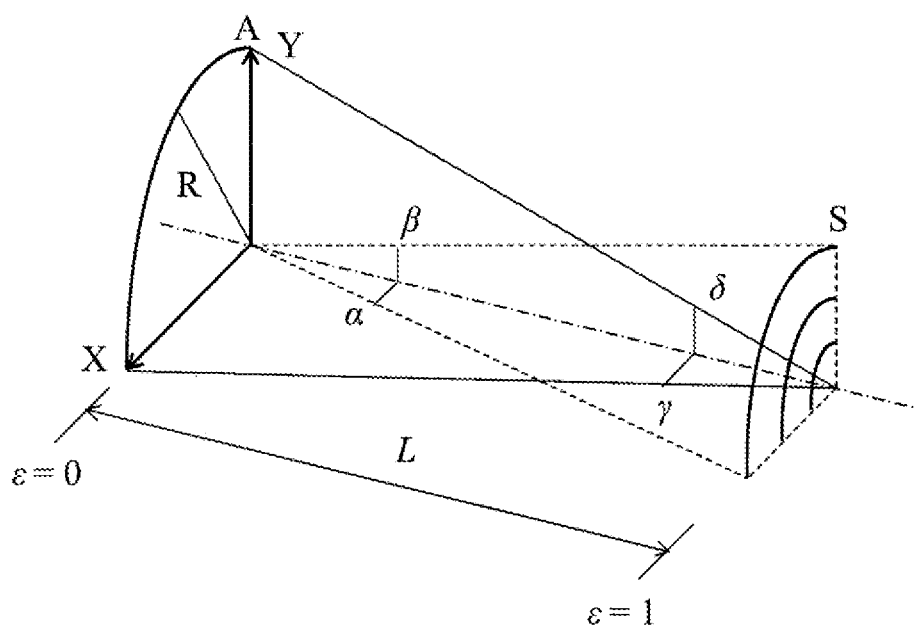
FIG. 31 is a diagram illustrating the distance L between a crossover plane and an image plane.

"Ri" indicates the radius of the image on the achromatic plane. "Di" indicates the radius of the image on the energy dispersive plane. γ and δ are angular apertures of the crossover. α and β are angular apertures of the image (see FIG. 31).

ΔEx is the geometric aberration in the direction of dispersion at the energy dispersive plane. ΔExc is the chromatic aberration in the direction of dispersion at the energy dispersive plane. Δ is the geometric aberration at the achromatic plane. Δc is the chromatic aberration at the achromatic plane. Δf is the geometric aberration at the achromatic plane, converted to the final focal plane. Δcf is the chromatic aberration at the achromatic plane, converted to the final focal plane.

It is seen from the table of FIG. 9 that the level of the performance of the U-type is improved almost by two orders of magnitude than the ΩB-type in terms of aberrations at the achromatic plane. As shown in FIG. 9, in the U-type, the aberration (blur) of the achromatic plane at the final focal plane is less than 10 μm. The size of pixels of a CCD camera installed as an imager on an electron microscope is generally about 10 μm. Accordingly, it can be said that in the U-type, the aberration (blur) can be reduced to such a level that it does not affect the resolution of the electron microscope. Consequently, in the U-type, no aberration correction is needed.

Furthermore, in the U-type, the aberration in the energy dispersive plane is suppressed to a level comparable to that in the ΩB-type. This is clearly demonstrated by a comparison of spot diagrams of both U-type and ΩB-type as given below.

Figure 10:
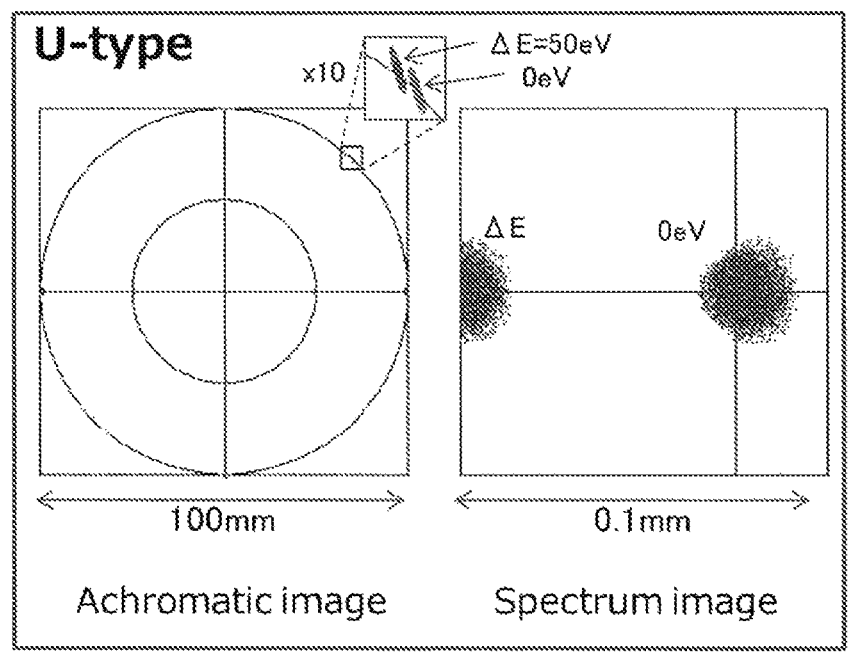
FIG. 10 is a diagram showing the result of a simulation of spot diagrams of an achromatic plane and an energy dispersive plane in the U-type.
Figure 11:
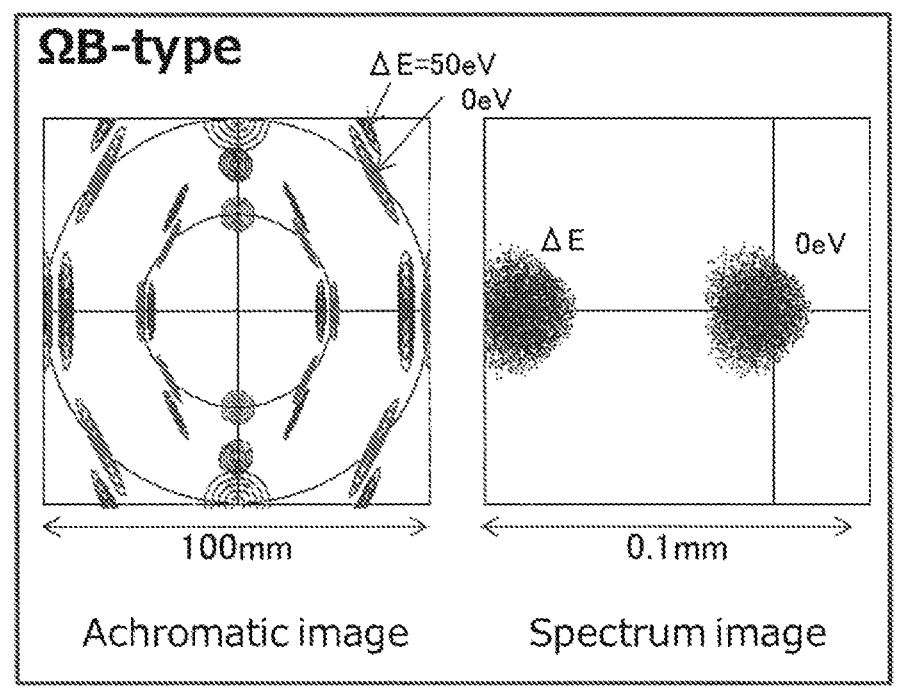
FIG. 11 is a diagram showing the result of a simulation of spot diagrams of an achromatic plane and an energy dispersive plane in the ΩB-type.

FIG. 10 is a diagram showing the results of simulations on spot diagrams (aberration plots) of the achromatic plane (final focal plane) and of the energy dispersive plane in the U-type. FIG. 11 is a diagram showing the results of simulations on spot diagrams (aberration plots) of the achromatic plane (final focal plane) and of the energy dispersive plane in the ΩΩB-type. In FIGS. 10 and 11, calculations have been performed on the assumption that energy loss width ΔE=50 eV.

In FIGS. 10 and 11, only aberration components arising from the energy filter are shown and do not contain components attributed to other focusing lenses. For ease of comparison, the achromatic image has been converted onto the final image screen (having a diameter of 100 mm), and the spot size is shown to be magnified 100 times.

At the achromatic image plane shown in FIGS. 10 and 11, two spots of electron beam rays having different energies because of dispersion of the electron beam are spaced 45 degrees apart on a circumference.

Where there is no aberration, each spot is an ideal point. However, where there are geometric and chromatic aberrations, blurred spots occur. In the 9B-type, spots are blurred greatly especially in the Y (longitudinal) direction. In the U-type, spots are less blurred than in the ΩB-type and shown as nearly complete spots.

In the spectrum image at the energy dispersive plane shown in FIGS. 10 and 11, two electron beam rays having different energies due to dispersion of the electron beam manifest themselves in the form of spots. Where there are no aberrations, spots assume the form of round beam rays each having a radius Di=0.01 mm. Where there are geometric and chromatic aberrations, triangular, blurred spots occur.

At the energy dispersive plane, spots in the U-type are blurred to an approximately equal level to spots in the ΩB-type and suppressed to a low level.

The U-type and the ΩB-type produce nearly equal aberration coefficients. Therefore, it seems that the U-type has no advantages over the ΩB-type. The essential difference between both types is that the distance L in the U-type is greater by one order of magnitude than in the ΩB-type.

As an example, it is assumed that the distance L in the ΩB-type is set to 100 mm and the distance L in the U-type is set to 1000 mm. If both types are identical in aberration coefficients, the angular apertures α and β in the U-type can be set lower by one order of magnitude and, therefore, the aberrations at the achromatic plane are lower by one order of magnitude. If both types are identical in total magnification, the magnitude of the intermediate lens of the U-type is larger and so the magnification of the projector lens is lower. For this reason, in the U-type, the aberrations at the achromatic plane can be suppressed from increasing at the final focal plane. That is, the magnification of the projector lens decreases and so the aberrations are lowered further by one order of magnitude. Consequently, in the U-type, the aberrations can be reduced by nearly two orders of magnitude as a whole as compared with the ΩB-type.

If the distance L is increased, the entrance image plane needs to be increased accordingly without varying the angular apertures γ and β of the crossover. It is quite easy to set the intermediate lens system in such a manner because the focal point at the image plane can be varied simply by varying the excitation of the intermediate lens system. This results in an increase in size of the exit image plane. However, it is also easy to set the projector lens system for similar reasons.

Figure 12:
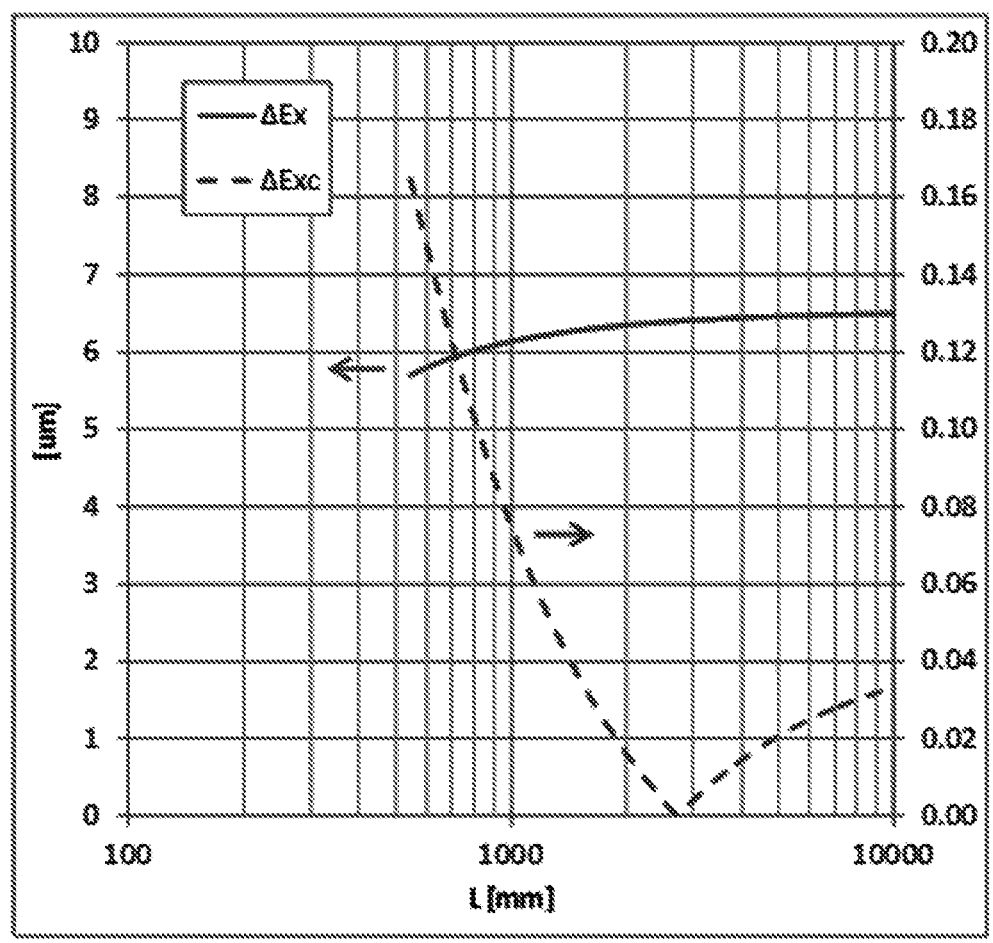
FIG. 12 is a graph in which the geometric aberration ΔEx in the direction of dispersion and chromatic aberration ΔExc at the energy dispersive plane are plotted against the distance L.
Figure 13:
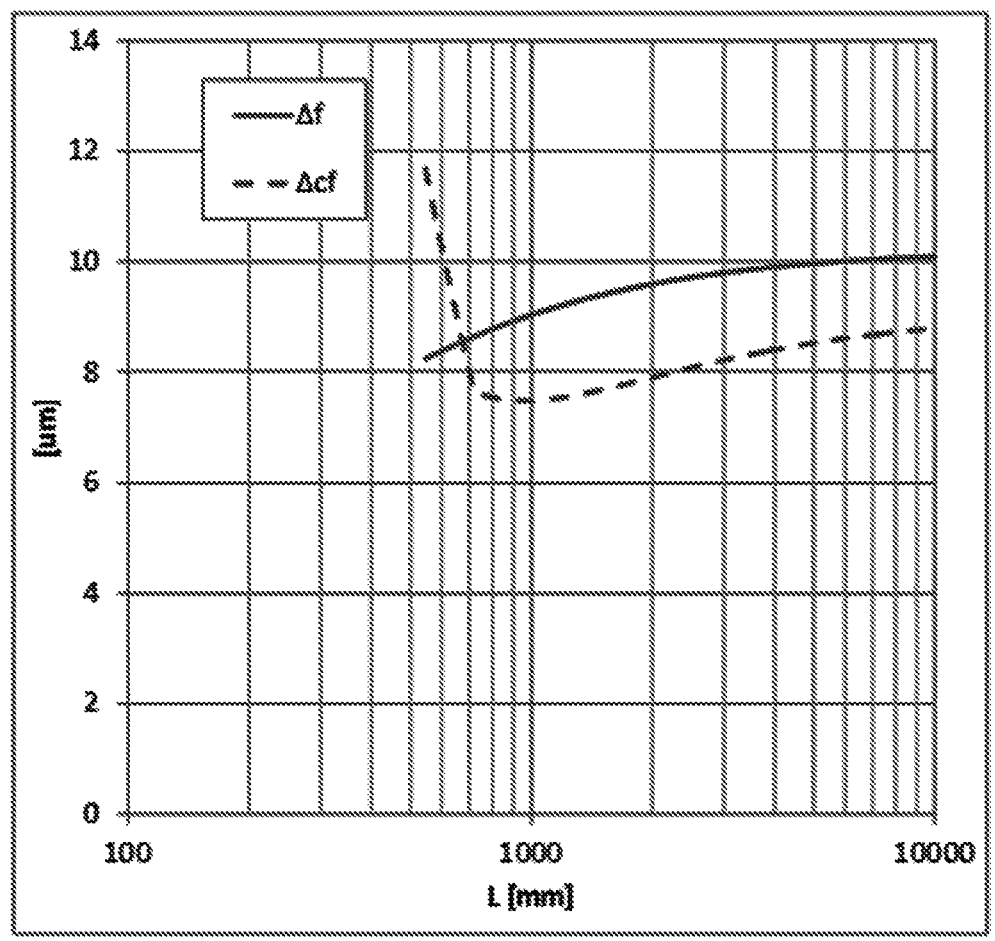
FIG. 13 is a graph in which the geometric aberration Δf and chromatic aberration Δcf at the achromatic plane converted into a final imaging plane are plotted against the distance L.

FIG. 12 is a graph in which geometric aberration ΔEx and chromatic aberration ΔExc in the direction of dispersion at the energy dispersion plane are plotted against the given distance L. FIG. 13 is a graph in which geometric aberration Δf and chromatic aberration Δcf at the achromatic plane converted to the final focal plane are plotted against the given distance L.

The graphs of FIGS. 12 and 13 show that the U-type can exhibit well balanced performance in a range of the distance L from 700 mm to 5,000 mm where the geometric aberration Δf and chromatic aberration Δcf at the achromatic plane are less than 10 μm.

3. MODIFIED EXAMPLES

It is to be understood that the present invention is not restricted to the foregoing embodiment but rather can be implemented in variously modified forms without departing from the gist of the present invention. In the following description of energy filters 200, 300, 400, 500, 600, 700, and 800 associated with modified examples of the present embodiment, those members which are similar in function to their respective counterparts of the above-described energy filter 100 are indicated by the same reference numerals as in the above cited figures and a description thereof is omitted.

3.1. First Modified Example

Figure 14:
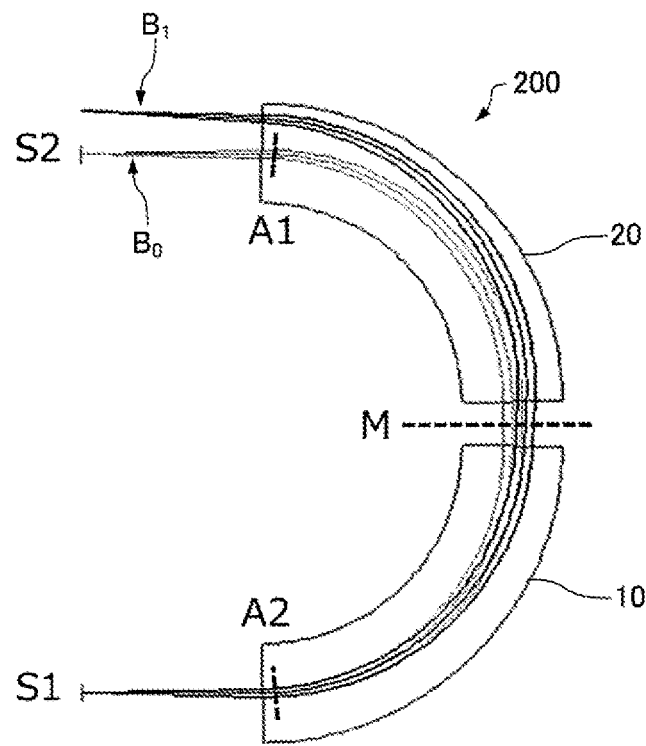
FIG. 14 is a diagram showing trajectories of an electron beam in an energy filter associated with a first modified example.
Figure 15:
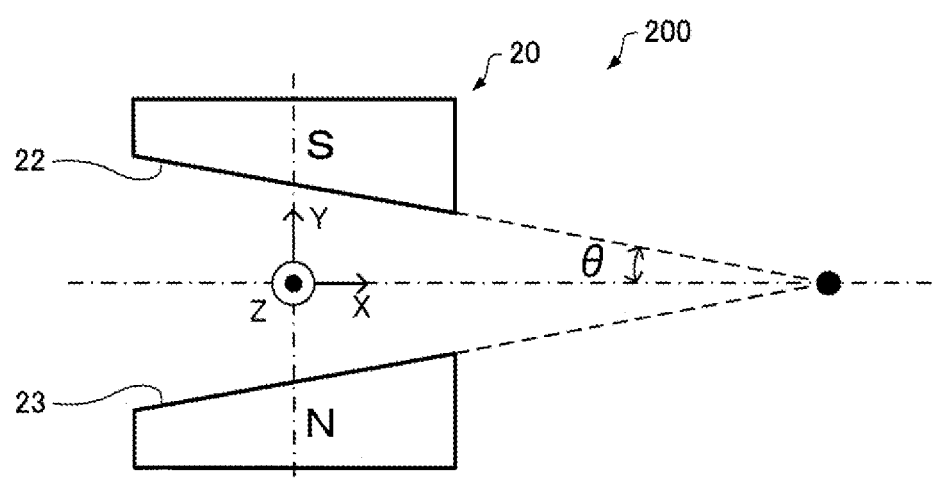
FIG. 15 is a schematic cross-sectional view of the second sector magnet of the energy filter shown in FIG. 14.

FIG. 14 is a diagram illustrating trajectories of an electron beam in the energy filter 200 associated with a first modified example. In FIG. 14, the trajectory of zero-loss beam rays B0 and the trajectory of dispersed beam rays B1 are shown. FIG. 15 is a schematic cross section of the second sector magnet 20 of the energy filter 200 associated with the first modified example.

In the energy filter 200, the same focusing action is produced at all times for both X and Y directions. That is, in the energy filter 200, a round lens focus is formed.

In the energy filter 200, the round lens focus is accomplished by setting the tilt angle θ of the opposite polepiece surfaces of the first sector magnet 10 and the tilt angle θ of the opposite polepieces surfaces 22 and 23 of the second sector magnet 20 to a given value, it being noted that the tilt angle θ≠0°.

In the energy filter 200, the end surface angles T1 and T2 of the first sector magnet 10 are 0°, and the end surface angles T1 and T2 of the second sector magnet 20 are also 0°.

The energy filter 200 associated with the present modified example can yield advantageous effects similar to those provided by the above-described energy filter 100.

3.2. Second Modified Example

Figure 16:
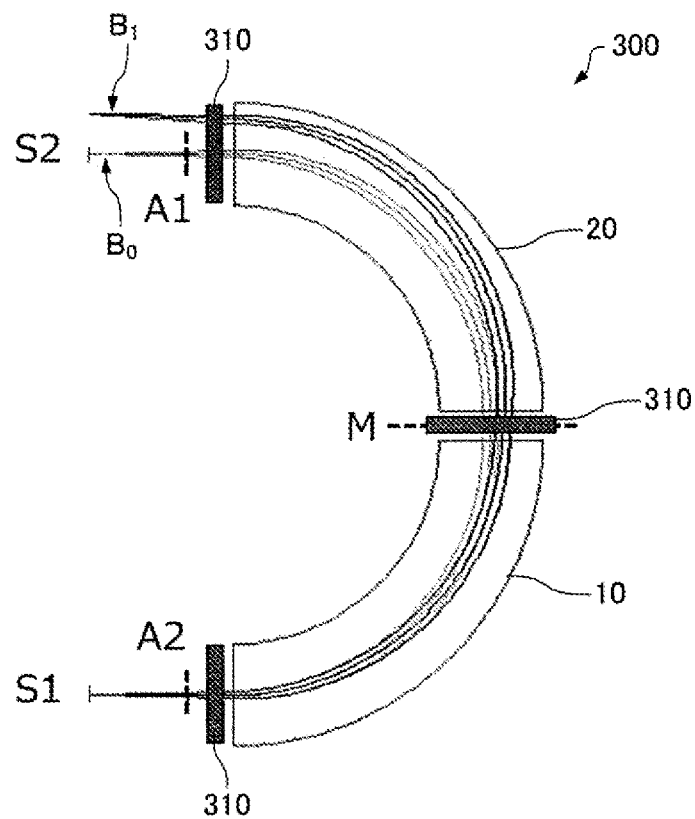
FIG. 16 is a diagram showing trajectories of an electron beam in an energy filter associated with a second modified example.
Figure 17:
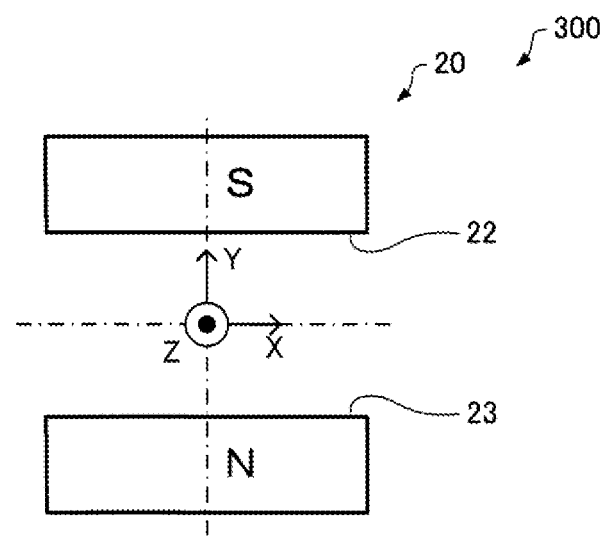
FIG. 17 is a schematic cross-sectional view of the second sector magnet of the energy filter shown in FIG. 16.

FIG. 16 is a diagram showing trajectories of an electron beam in the energy filter 300 associated with a second modified example. FIG. 17 is a schematic cross section of the second sector magnet 20 of the energy filter 300 associated with the second modified example.

In the energy filter 300, a stigmatic focus is formed in the same way as in the energy filter 100. In the energy filter 300, magnetic quadrupoles 310 are disposed respectively at the entrance and exit of the first sector magnet 10 and at the entrance and exit of the second sector magnet 20. The magnetic quadrupoles 310 can exert a focusing action on the electron beam in the Y direction. Consequently, the stigmatic focus is accomplished in the energy filter 300.

In the energy filter 300, the end surface angles T1 and T2 of the first sector magnet 10 are equal to 0°, and the end surface angles T1 and T2 of the second sector magnet 20 are also equal to 0°.

In the energy filter 300, as shown in FIG. 17, the opposite polepiece surfaces 22 and 23 of the second sector magnet 20 are not tilted (i.e., the tilt angle θ=0°). Similarly, the opposite polepiece surfaces of the first sector magnet 10 are not tilted.

The energy filter 300 associated with the present modified example can yield advantageous effects similar to those provided by the above-described energy filter 100.

3.3. Third Modified Example

Figure 18:
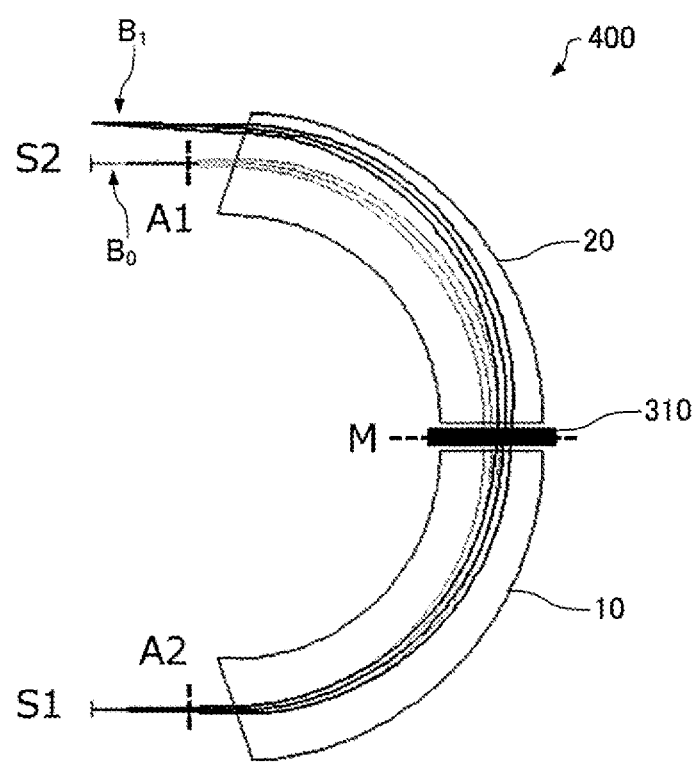
FIG. 18 is a diagram showing trajectories of an electron beam in an energy filter associated with a third modified example.

FIG. 18 is a diagram showing trajectories of an electron beam in the energy filter 400 associated with a third modified example. In the energy filter 400, a stigmatic focus is formed in the same way as in the energy filter 100.

In the energy filter 400, a magnetic quadrupole 310 is disposed between the exit of the first sector magnet 10 and the entrance of the second sector magnet 20 under the condition that the end surface angle T1=0°. Furthermore, at the entrance of the first sector magnet 10 and at the exit of the second sector magnet 20, the end surface angle T2≠0°. In consequence, in the energy filter 400, a stigmatic focus is accomplished.

Alternatively, in an unillustrated manner, magnetic quadrupoles 310 may be disposed respectively at the entrance of the first sector magnet 10 and at the exit of the second sector magnet 20 under the condition where the end surface angle T2=0°, and the end surface angles T1 at the exit of the first sector magnet 10 and at the entrance of the second sector magnet 20 may be set unequal to zero (T1≠0°).

In the energy filter 400, the opposite polepiece surfaces 22 and 23 of the second sector magnet 20 are not tilted (tilt angle θ=0°) and similarly the opposite polepiece surfaces of the first sector magnet 10 are not tilted in a manner not illustrated.

The energy filter 400 associated with the present modified example can yield advantageous effects similar to those provided by the energy filter 100 described above.

3.4. Fourth Modified Example

Figure 19:
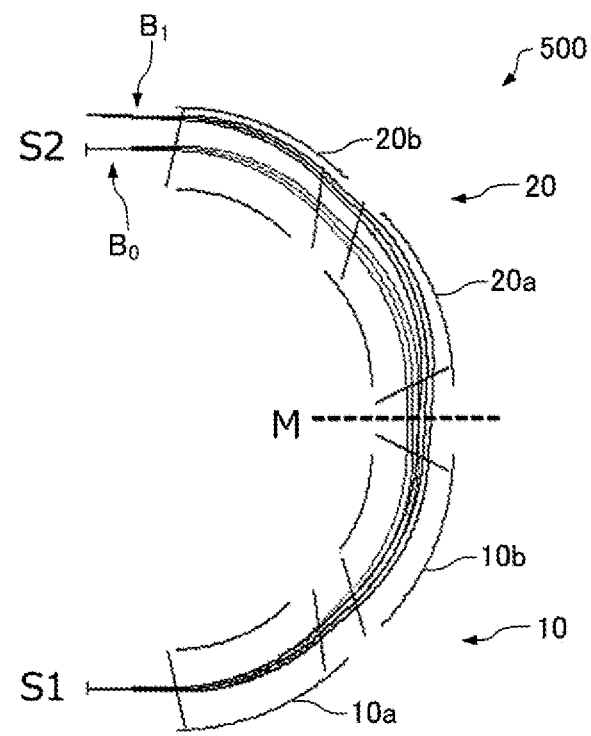
FIG. 19 is a diagram showing trajectories of an electron beam in an energy filter associated with a fourth modified example.

FIG. 19 is a diagram showing trajectories of an electron beam in the energy filter 500 associated with a fourth modified example. In the energy filter 500, as shown in FIG. 19, the first sector magnet 10 is divided into a plurality of segments. Similarly, the second sector magnet 20 is divided into a plurality of segments.

In the illustrated example, the first sector magnet 10 is divided into a first segment 10*a* and a second segment 10*b*. Similarly, the second sector magnet 20 is divided into a first segment 20*a* and a second segment 20*b*. The first segment 10*a* and second segment 10*b* of the first sector magnet 10 and the first segment 20*a* and second segment 20*b* of the second sector magnet 20 are identical in polarity.

The first sector magnet 10 and second sector magnet 20 which are divided have the same function as when they are not divided.

No restriction is imposed on the number of segments of each of the first sector magnet 10 and second sector magnet 20. The energy filter 500 associated with the present modified example can yield advantageous effects similar to those provided by the energy filter 100 described above.

3.5. Fifth Modified Example

Figure 20:
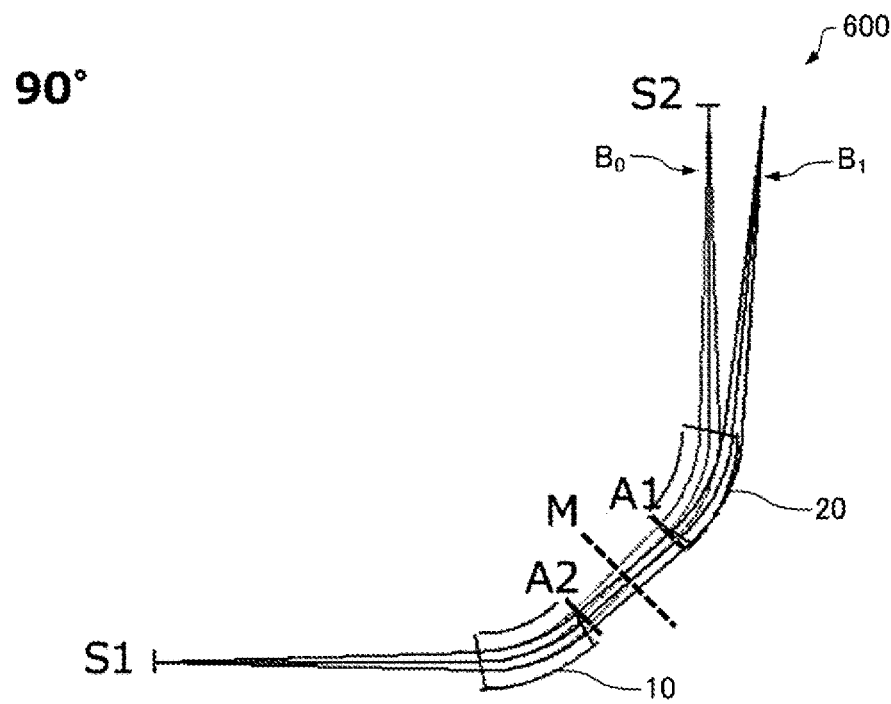
FIGS. 20-23 are diagrams showing trajectories of an electron beam in an energy filter associated with a fifth modified example.
Figure 21:
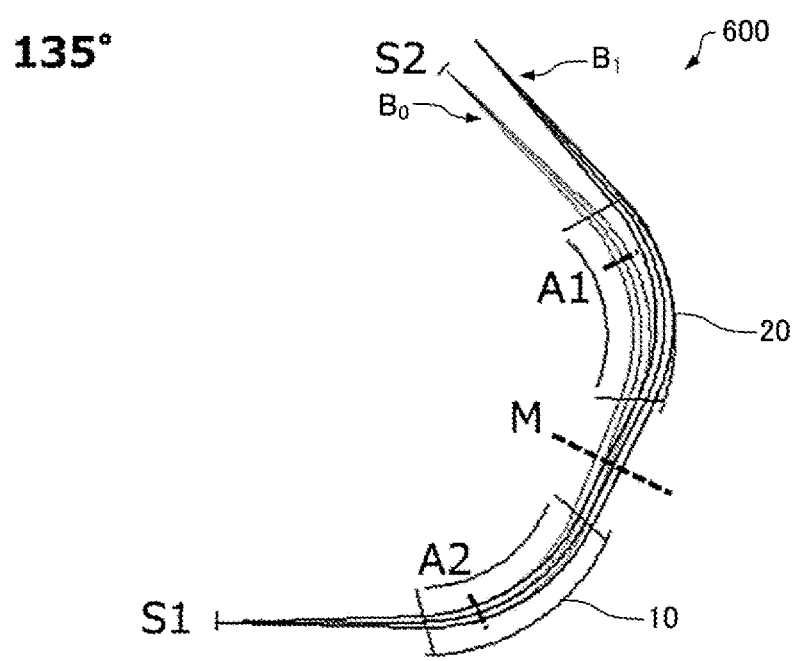
Figure 22:
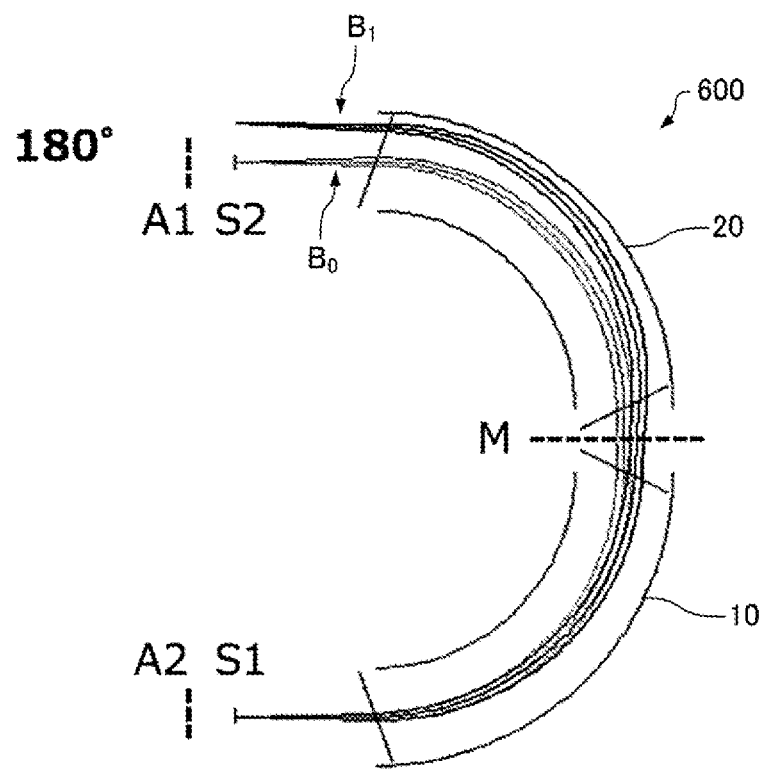
Figure 23:
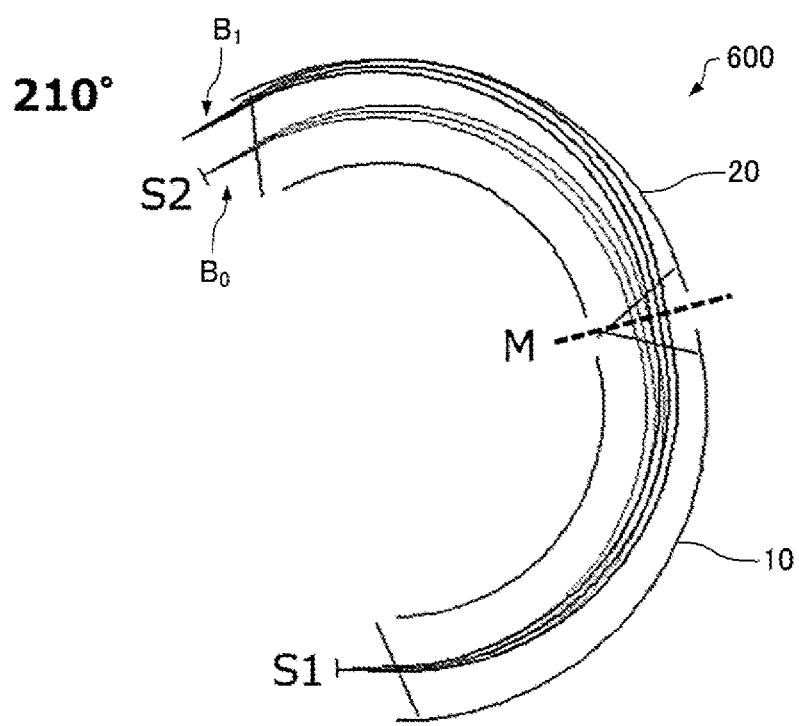

FIGS. 20-23 are diagrams showing trajectories of an electron beam in the energy filter 600 associated with a fifth modified example. FIG. 20 shows a case where the sum of the deflection angle of the electron beam in the first sector magnet 10 and the deflection angle of the electron beam in the second sector magnet 20 is 90°. FIG. 21 shows a case where the sum of the deflection angle of the electron beam in the first sector magnet 10 and the deflection angle of the electron beam in the second sector magnet 20 is 135°. FIG. 22 shows a case where the sum of the deflection angle of the electron beam in the first sector magnet 10 and the deflection angle of the electron beam in the second sector magnet 20 is 180°. FIG. 23 shows a case where the sum of the deflection angle of the electron beam in the first sector magnet 10 and the deflection angle of the electron beam in the second sector magnet 20 is 210°.

As shown in FIGS. 20-23, according to the fifth modified example, the sum of the deflection angle of the electron beam in the first sector magnet 10 and the deflection angle of the electron beam in the second sector magnet 20 can be set to within a range of from 90° to 210°, inclusively. Consequently, in the electron microscope 1, the energy filter 600 can be placed in the portion that interconnects the two electron optical columns 8a and 8b. Hence, increases in the height of the electron microscope can be suppressed.

In the energy filter 600 shown in FIGS. 20-23, the minimum value of the distance L at which the crossover and the image can be focused in the X and Y directions has been described above (see Table 1). The energy filter 600 associated with the present modified example can yield advantageous effects similar to those provided by the energy filter 100 described above.

3.6. Sixth Modified Example

Figure 24:
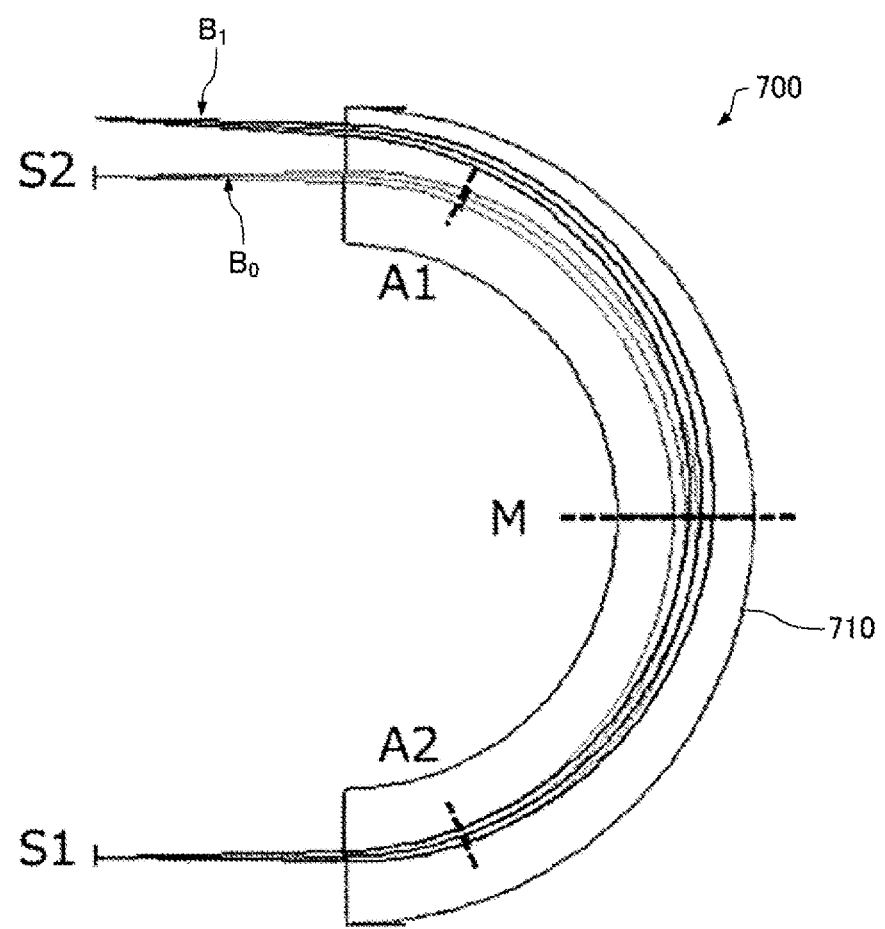
FIG. 24 is a diagram showing trajectories of an electron beam in an energy filter associated with a sixth modified example.
Figure 25:
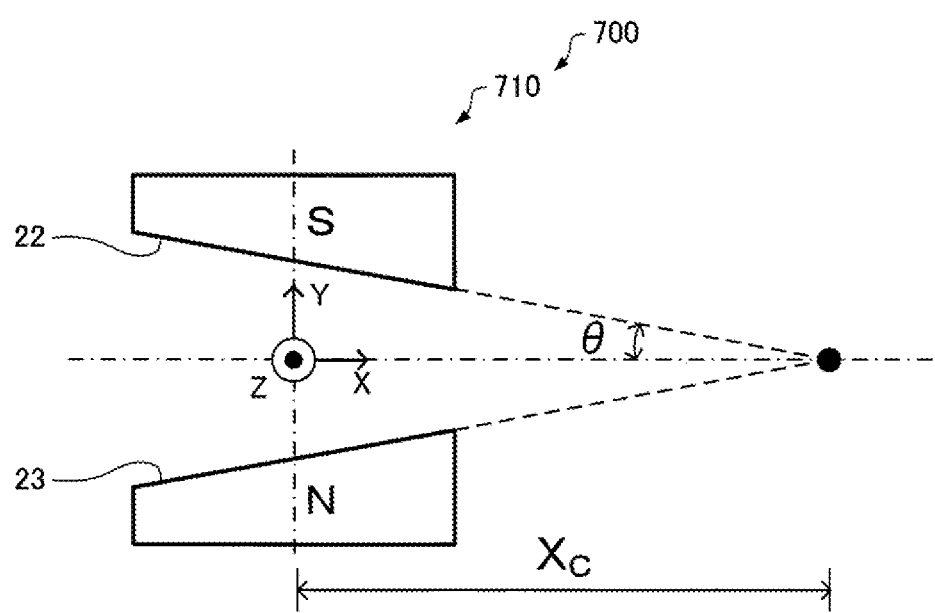
FIG. 25 is a schematic cross-sectional view of a sector magnet of the energy filter shown in FIG. 24.

FIG. 24 is a diagram showing trajectories of an electron beam in the energy filter 700 associated with a sixth modified example. FIG. 24 shows the trajectory of zero-loss beam rays B0 and the trajectory of dispersed beam rays B1. FIG. 25 is a schematic cross section of a sector magnet 710 of the energy filter 700 associated with the sixth modified example.

In the energy filter 700, a round lens focus is formed in the same way as in the energy filter 200 described above. The above-described energy filter 200 is configured including the first sector magnet 10 and second sector magnet 20 which are mirror-symmetric with respect to the symmetry plane M as shown in FIG. 1. On the other hand, the energy filter 700 is made of the single unitary sector magnet 710, as shown in FIG. 24. In other words, in the energy filter 700, the first sector magnet 10 and second sector magnet 20 are not separated but rather constitute a single unitary structure.

The sector magnet 710 is configured mirror-symmetrically with respect to the symmetry plane M. In the sector magnet 710, the deflection angle of the electron beam is 180° ($\Theta$=180°).

The optical conditions for the energy filter 700 are similar to the optical conditions for the energy filter 200 described above. In particular, in the energy filter 700, there are one focal point of the crossover in the X direction and one focal point of the crossover in the Y direction except for focusing at the first entrance crossover plane S1 in the same way as for the energy filter 200. Where the first entrance crossover plane S1 is excluded, the focal point of the crossover in the X direction and the focal point of the crossover in the Y direction are at the energy dispersive plane S2. There are two focal points of the image in the X direction and two focal points of the image in the Y direction except for focusing at the first entrance image plane A1. Where the first entrance image plane A1 is excluded, the focal points of the image in the X direction and the focal points of the image in the Y direction are at the symmetry plane M and at the achromatic plane A2. When the image is focused in the X and Y directions, a real image is formed at the position of the symmetry plane M. The entrance crossover plane S1 and the energy dispersive plane S2 (exit crossover plane) are located mirror-symmetrically with respect to the symmetry plane M. The entrance image plane A1 and the achromatic plane A2 (exit image plane) are located mirror-symmetrically with respect to the symmetry plane M.

The tilt angle $\theta$ of the opposite polepiece surfaces 22 and 23 of the sector magnet 710 satisfies the round lens focus condition. That is, the tilt angle $\theta$ of the opposite polepiece surfaces 22 and 23 of the sector magnet 710 can accomplish a round lens focus (tilt angle $\theta \neq 0°$). Since the tilt angle $\theta$ of the opposite polepiece surfaces 22 and 23 of the sector magnet 710 satisfies the round lens focus condition, the end surface angles T1=T2=0°.

As shown in FIG. 25, the opposite polepiece surfaces 22 and 23 of the sector magnet 710 are tilted (i.e., the tilt angle $\theta \neq 0°$). That is, the opposite polepiece surfaces 22 and 23 of the sector magnet 710 are not parallel to each other.

The distance L (see FIG. 1) assumes its minimum value within a range in which focusing is possible. At this time, the distance L=0 mm.

In the example shown in FIG. 24, the deflection angle $\Theta$=180°. The distance L at which the crossover and the image can be focused in the X and Y directions is approximately equal to 526 mm. That is, the distance L is approximately 3.5 R and assumes its minimum value within a range in which focusing is possible, it being noted that the deflection angle R=150 mm. The energy filter 700 associated with the present modified example can yield advantageous effects similar to those produced by the above-described energy filter 100.

In the energy filter 700 associated with the present modified example, the deflection angle of the electron beam in the sector magnet 710 is 180°. The sector magnet 710 is not separated at the symmetry plane M but constitutes a single unit. The tilt angle of the opposite polepiece surfaces 22 and 23 of the sector magnet 710 is not equal to 00 (i.e., $\theta \neq 0°$). Furthermore, the round lens focus condition is satisfied. The distance L is approximately 3.5 R. Therefore, the energy filter 700 can be simplified in structure. Also, the energy filter can accomplish low aberrations.

In the foregoing case, the deflection angle of the electron beam in the unitary sector magnet 710 is 180° ($\Theta$=180°). The deflection angle of the electron beam in the unitary sector magnet is not restricted to 180°.

Figure 26:
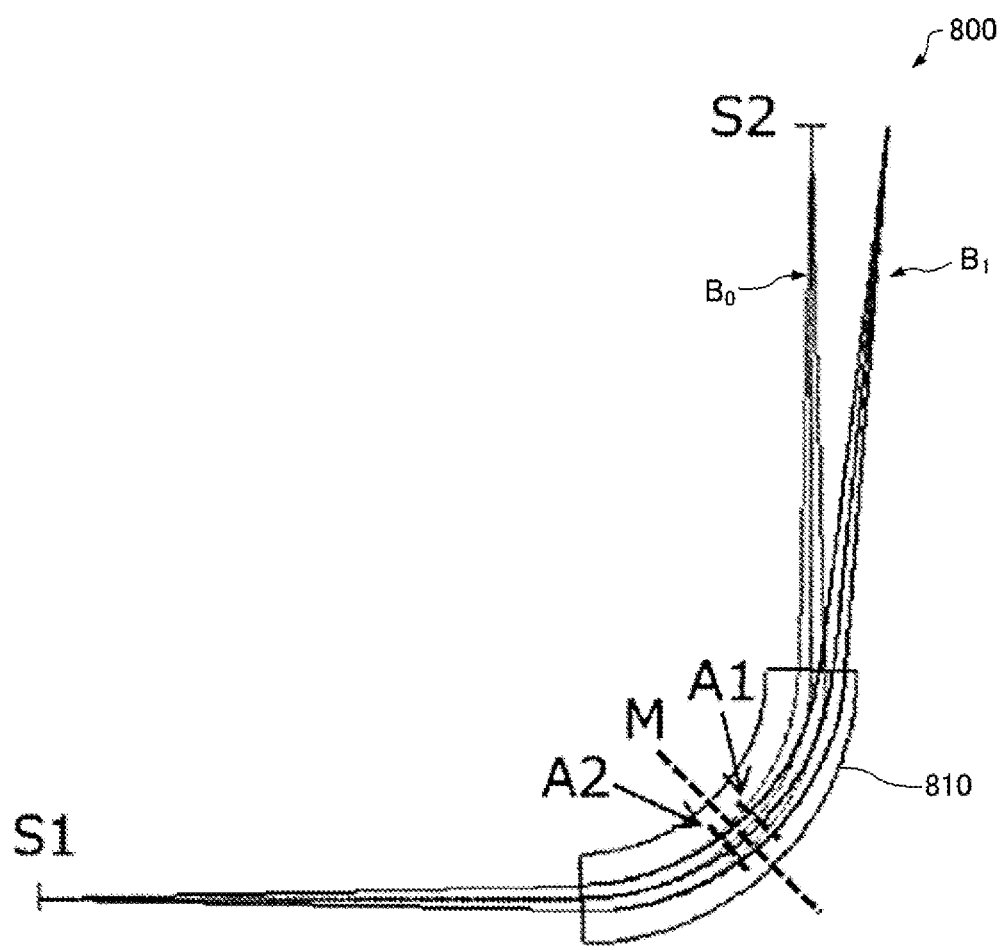
FIG. 26 is a diagram showing trajectories of an electron beam in another energy filter associated with the sixth modified example.
Figure 27:
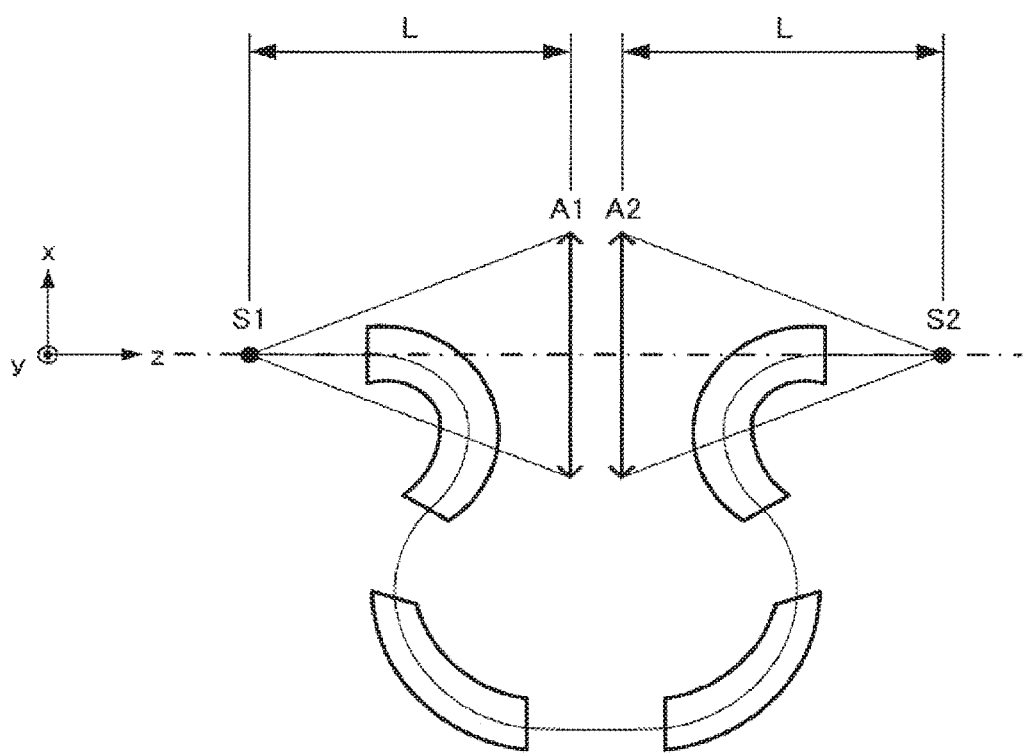
FIG. 27 is a schematic view of a conventional in-column energy filter.
Figure 28:
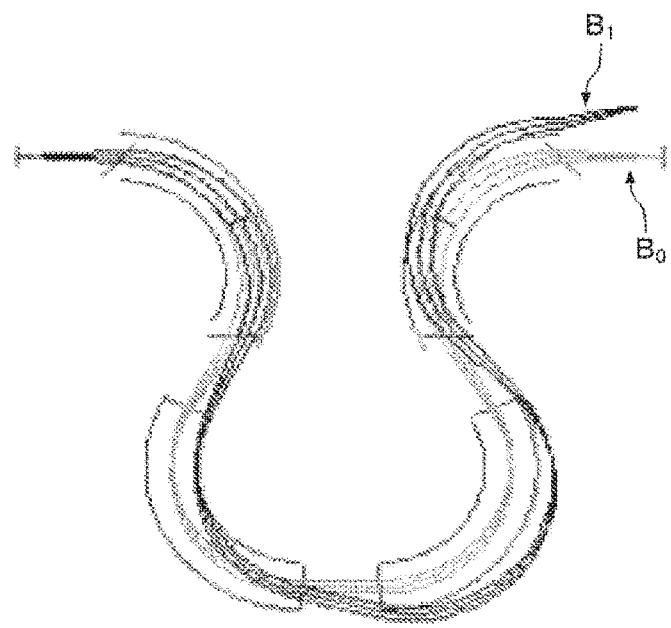
FIG. 28 is a diagram showing trajectories of an electron beam in the conventional in-column energy filter.
Figure 29:
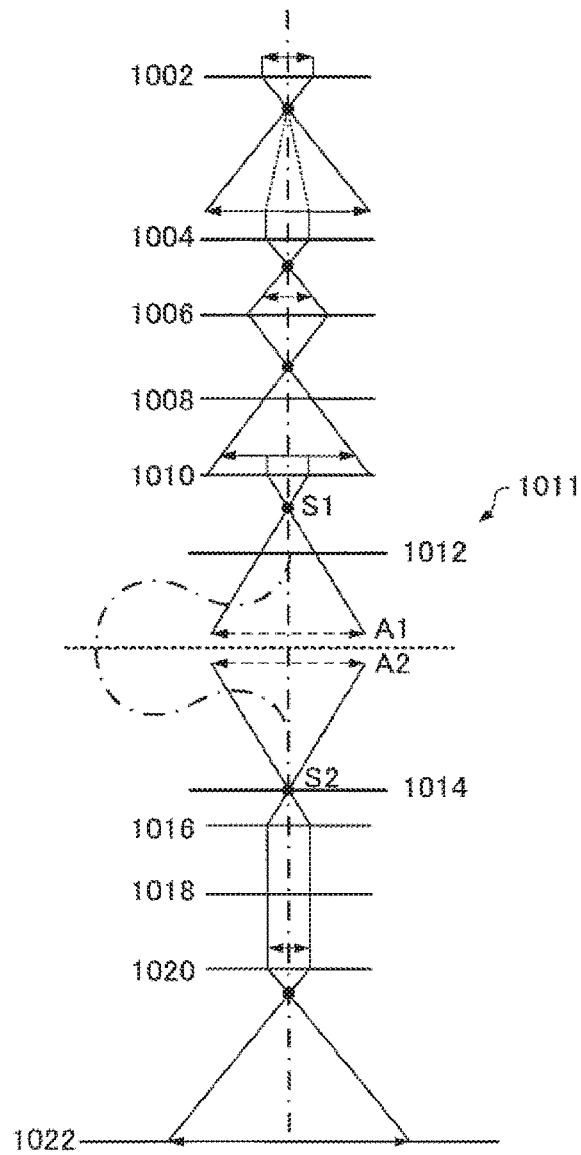
FIGS. 29 and 30 are diagrams of the conventional in-column energy filter and one example of optical system in front and behind the filter.
Figure 30:
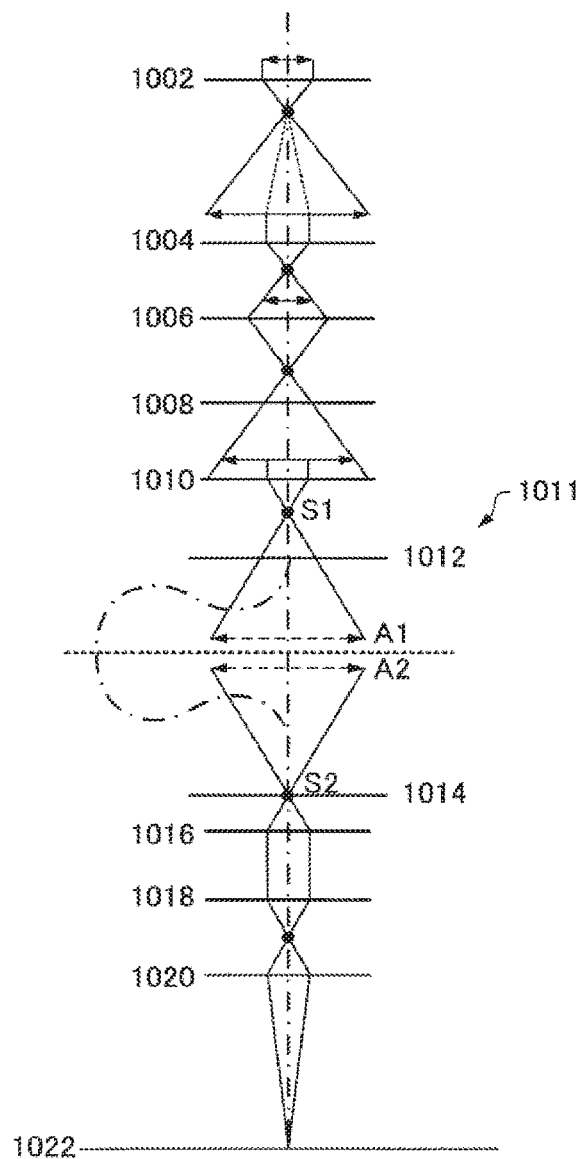

For example, the energy filter 800 shown in FIG. 26 is configured including a single unitary sector magnet 810. The deflection angle of the electron beam in the sector magnet 810 is 90° ($\Theta$=90°). In the example shown in FIG. 26, the deflection angle $\Theta$=90°. The distance L at which the crossover and image can be focused in the X and Y directions is approximately equal to 491 mm. That is, the distance L assumes its minimum value within a range in which focusing is possible under the condition where L≅3.3 R, in which the deflection angle R=150 mm. In other respects, the sector magnet 810 is similar to the sector magnet 710 and a description thereof is omitted. The energy filter 800 associated with the present modified example can yield advantageous effects similar to those provided by the above-described energy filter 700.

In the energy filter 800 associated with the present modified example, the deflection angle of the electron beam in the sector magnet 810 is 90°. The sector magnet 810 is not separated at the symmetry plane M but is a unitary structure. The tilt angle of the opposite polepiece surfaces of the sector magnet 810 is not equal to 00. Also, the round lens focus condition is satisfied. The distance L is approximately 3.3 R. Therefore, the energy filter 800 can be simplified in structure. Also, the energy filter can accomplish low aberrations.

It is to be noted that the above-described embodiments and modified examples are merely exemplary and that the invention is not restricted thereto. For example, the embodiments and modified examples may be appropriately combined.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

Having thus described my invention with the detail and particularity required by the Patent Laws, what is desired protected by Letters Patent is set forth in the following claims.

The invention claimed is:

1. An energy filter comprising a first sector magnet and a second sector magnet for producing deflecting magnetic fields to deflect a charged particle beam, wherein
the first sector magnet and the second sector magnet are configured mirror-symmetrically with respect to a symmetry plane,
the first sector magnet and the second sector magnet are identical in polarity,
the first sector magnet and the second sector magnet together constitute an optical system for focusing a crossover and an image,
the charged particle beam travels in a Z direction,
the charged particle beam is deflected by the deflecting magnetic fields in an X direction,
the deflecting magnetic fields produce lines of magnetic force that lie in a Y direction,
there are one focal point of the crossover in the X direction and one focal point of the crossover in the Y direction except for focusing at a first entrance crossover plane,
the focal point of the crossover in the X direction and the focal point of the crossover in the Y direction are at an energy dispersive plane if the first entrance crossover plane is excluded,
there are two focal points of the image in the X direction and two focal points of the image in the Y direction except for focusing at the first entrance image plane,
the focal points of the image in the X direction and the focal points of the image in the Y direction are at the symmetry plane and at an achromatic plane if the first entrance image plane is excluded,
a real image is formed at the position of the symmetry plane when the first-mentioned image is focused in the X and Y directions,
the entrance crossover plane and the energy dispersive plane are positioned mirror-symmetrically with respect to the symmetry plane,
the entrance image plane and the achromatic plane are positioned mirror-symmetrically with respect to the symmetry plane,
the sum of the deflection angle of the charged particle beam in said first sector magnet and the deflection angle of the charged particle beam in said second sector magnet is 180 degrees,
each of said first and second sector magnets has two mutually opposite polepiece surfaces which are parallel to each other, and
the distance L between said energy dispersive plane and said achromatic plane satisfies the relation: L>3.6R, where R is the radius of a central trajectory of the charged particle beam in the second sector magnet.

2. The energy filter as set forth in claim 1, wherein the sum of the angle of deflection through which said charged particle beam is deflected in said first sector magnet and the angle of deflection through which the beam is deflected in said second sector magnet is in a range of from 90 degrees to 210 degrees, inclusively.

3. The energy filter as set forth in claim 1, wherein said first sector magnet is divided into a plurality of segments, and wherein said second sector magnet is divided into a plurality of segments.

4. A charged particle beam system including an energy filter as set forth in claim 1.

5. The charged particle beam system as set forth in claim 4, further comprising an intermediate lens system and a projector lens system, and wherein said energy filter is disposed between the intermediate lens system and the projector lens system.

6. The charged particle beam system as set forth in claim 5, wherein said intermediate lens system brings a diffraction pattern of a sample into focus at the entrance crossover plane of said energy filter and brings an image of the sample into focus at the entrance image plane of the energy filter.

7. The charged particle beam system as set forth in claim 5, wherein said intermediate lens system brings an image of a sample into focus at the entrance crossover plane of said energy filter and brings a diffraction pattern of the sample into focus at the entrance image plane of the energy filter.

8. An energy filter comprising a first sector magnet and a second sector magnet for producing deflecting magnetic fields to deflect a charged particle beam, wherein
the first sector magnet and the second sector magnet are configured mirror-symmetrically with respect to a symmetry plane,
the first sector magnet and the second sector magnet are identical in polarity,
the first sector magnet and the second sector magnet together constitute an optical system for focusing a crossover and an image,
the charged particle beam travels in a Z direction,
the charged particle beam is deflected by the deflecting magnetic fields in an X direction,
the deflecting magnetic fields produce lines of magnetic force that lie in a Y direction, there are one focal point of the crossover in the X direction and one focal point of the crossover in the Y direction except for focusing at a first entrance crossover plane, the focal point of the crossover in the X direction and the focal point of the crossover in the Y direction are at an energy dispersive plane if the first entrance crossover plane is excluded, there are two focal points of the image in the X direction and two focal points of the image in the Y direction except for focusing at the first entrance image plane, the focal points of the image in the X direction and the focal points of the image in the Y direction are at the symmetry plane and at an achromatic plane if the first entrance image plane is excluded, a real image is formed at the position of the symmetry plane when the first-mentioned image is focused in the X and Y directions, the entrance crossover plane and the energy dispersive plane are positioned mirror-symmetrically with respect to the symmetry plane, the entrance image plane and the achromatic plane are positioned mirror-symmetrically with respect to the symmetry plane, the sum of the angle of deflection through which said charged particle beam is deflected in said first sector magnet and the angle of deflection through which the beam is deflected in said second sector magnet is 90 degrees, each of the first and second sector magnets has two mutually opposite polepiece surfaces which are parallel to each other, and the distance L between the energy dispersive plane and the achromatic plane satisfies the relation: $L>3.2R$, where R is the radius of a central trajectory of the charged particle beam in the second sector magnet.

* * * * *